US010340392B2

(12) United States Patent
Hara

(10) Patent No.: US 10,340,392 B2
(45) Date of Patent: Jul. 2, 2019

(54) SEMICONDUCTOR DEVICE INCLUDING MARK PORTION AND PRODUCTION METHOD FOR SAME

(71) Applicant: Sharp Kabushiki Kaisha, Sakai, Osaka (JP)

(72) Inventor: Yoshihito Hara, Sakai (JP)

(73) Assignee: Sharp Kabushiki Kaisha, Sakai (JP)

(*) Notice: Subject to any disclaimer, the term of this patent is extended or adjusted under 35 U.S.C. 154(b) by 0 days.

(21) Appl. No.: 15/762,572

(22) PCT Filed: Sep. 20, 2016

(86) PCT No.: PCT/JP2016/077638
§ 371 (c)(1),
(2) Date: Mar. 23, 2018

(87) PCT Pub. No.: WO2017/051791
PCT Pub. Date: Mar. 30, 2017

(65) Prior Publication Data
US 2018/0286985 A1 Oct. 4, 2018

(30) Foreign Application Priority Data
Sep. 24, 2015 (JP) ................................. 2015-186630

(51) Int. Cl.
*H01L 29/78* (2006.01)
*H01L 29/786* (2006.01)
(Continued)

(52) U.S. Cl.
CPC ........ *H01L 29/7869* (2013.01); *G02F 1/1368* (2013.01); *G02F 1/134309* (2013.01);
(Continued)

(58) Field of Classification Search
CPC .................................................. H01L 29/7869
See application file for complete search history.

(56) References Cited

U.S. PATENT DOCUMENTS 8,389,989 B2* 3/2013 Yamazaki ........... H01L 27/1225
257/43
2012/0138922 A1 6/2012 Yamazaki et al.
(Continued)

FOREIGN PATENT DOCUMENTS

JP 2012-134475 A 7/2012
JP 2014-007399 A 1/2014
(Continued)

*Primary Examiner* — William Coleman
(74) *Attorney, Agent, or Firm* — Keating & Bennett, LLP

(57) ABSTRACT

A semiconductor device includes a thin film transistor including an oxide semiconductor layer and a wire connecting portion (201). The wire connecting portion (201) includes a lower electrically-conductive portion (3t) formed out of a same electrically-conductive film as the gate electrode, an insulating layer (15) having a contact hole (CH2) through which at least a part of the lower electrically-conductive portion (3t) is exposed, and an upper electrically-conductive portion (19t), at least a part of which is provided inside the contact hole (CH2). The insulating layer (15) includes the gate insulating layer (4), the protection layer (9) and the interlayer insulating layer (13). At a lateral wall of the contact hole, the gate insulating layer (4) includes an upper portion (41) and a lower portion (42) which is present on the substrate side of the upper portion (41), and when viewed in a normal direction of the substrate, a lateral surface of the lower portion (42) juts out from a lateral surface of the upper portion (41). The upper electrically-conductive portion (19t) is in contact with the lower electrically-conductive portion (3t) and the lateral surface and an upper surface of the lower portion (42) of the gate insulating layer (4) inside the contact hole.

20 Claims, 13 Drawing Sheets

(51) Int. Cl.
*G02F 1/1368* (2006.01)
*G02F 1/1343* (2006.01)
*H01L 27/12* (2006.01)
*H01L 29/08* (2006.01)
*H01L 29/423* (2006.01)
*H01L 29/66* (2006.01)
*G02F 1/1362* (2006.01)

(52) U.S. Cl.
CPC .... *G02F 1/136227* (2013.01); *H01L 27/1225* (2013.01); *H01L 29/0847* (2013.01); *H01L 29/42384* (2013.01); *H01L 29/66969* (2013.01); *H01L 29/786* (2013.01); *H01L 29/78618* (2013.01); *G02F 2201/123* (2013.01); *G02F 2202/10* (2013.01); *H01L 29/66757* (2013.01)

(56) References Cited

U.S. PATENT DOCUMENTS

| | | |
|---|---|---|
| 2012/0241750 A1 | 9/2012 | Chikama et al. |
| 2013/0320334 A1 | 12/2013 | Yamazaki et al. |
| 2014/0286076 A1 | 9/2014 | Aoki et al. |

FOREIGN PATENT DOCUMENTS

| | | |
|---|---|---|
| JP | 2014-209727 A | 11/2014 |
| WO | 2011/070981 A1 | 6/2011 |

* cited by examiner

*FIG.3*
(a)
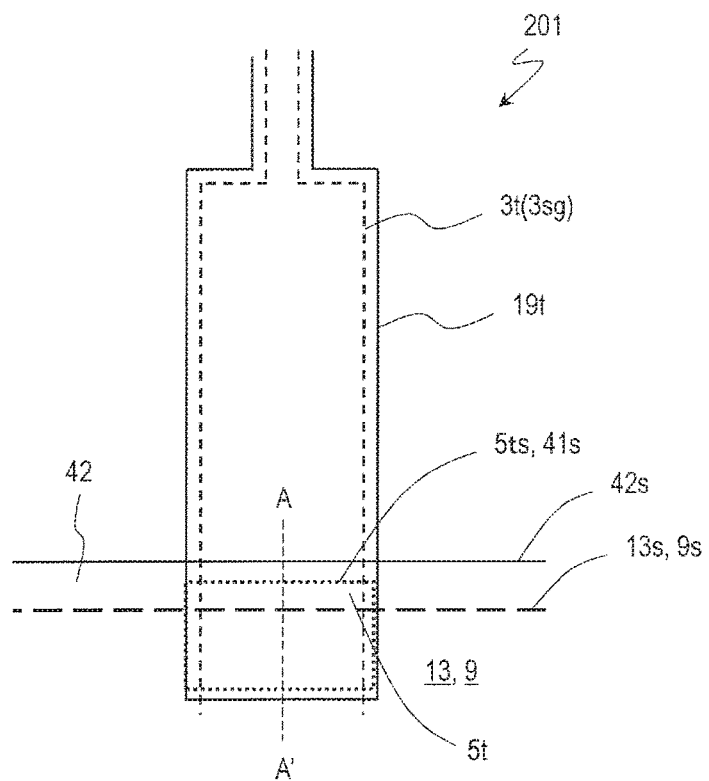
(b)
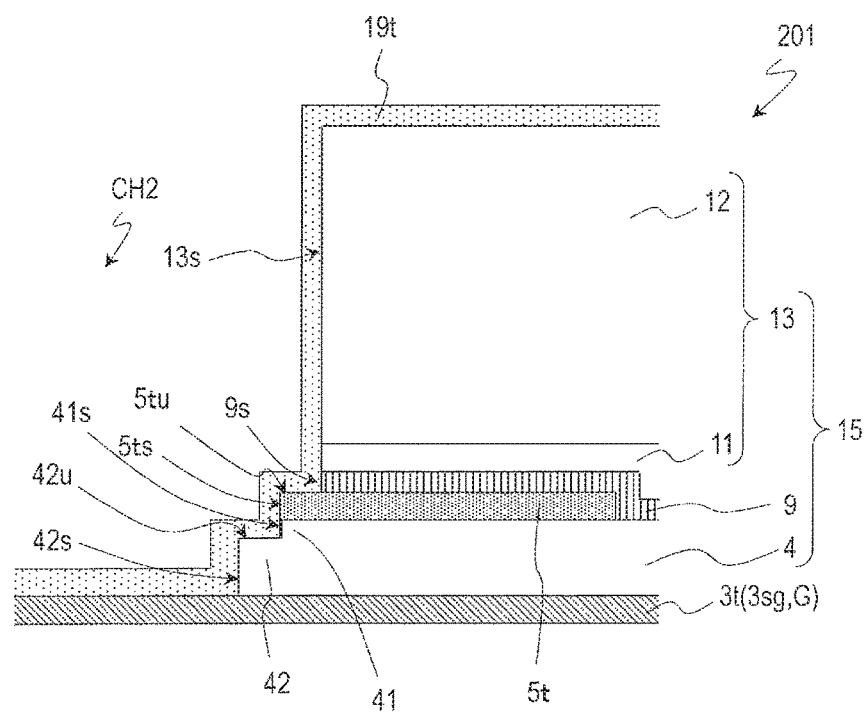

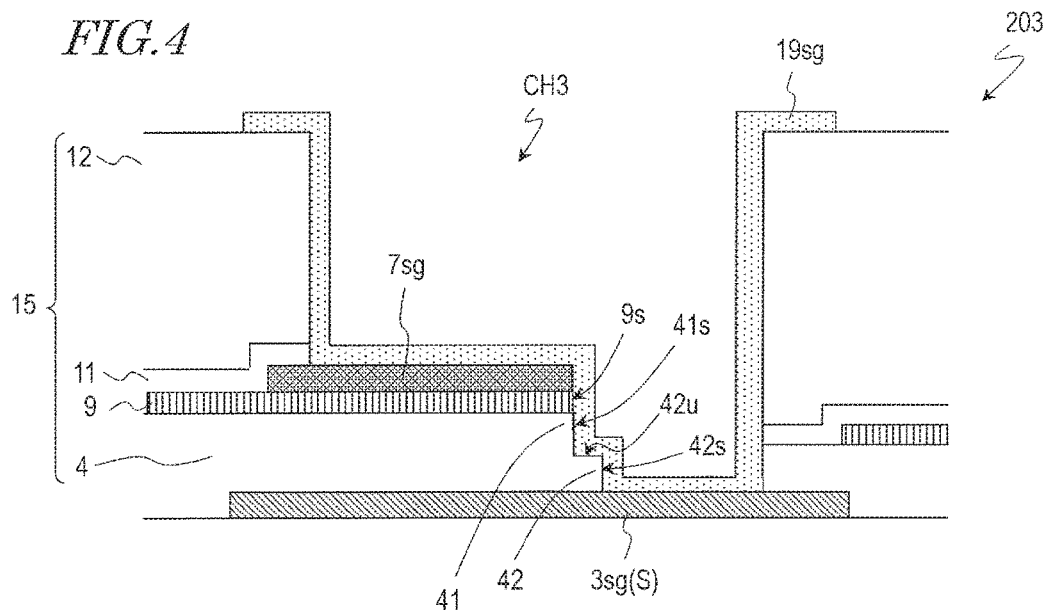
FIG.4
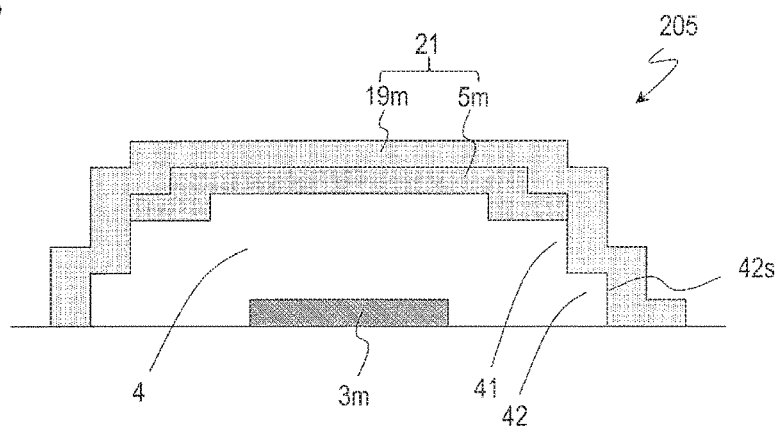
FIG.5
(a)
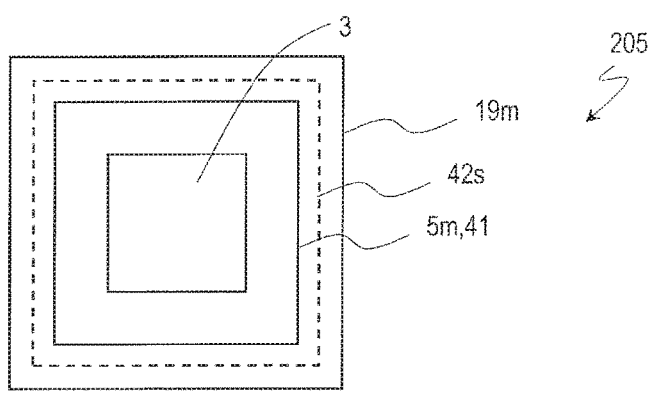
(b)

*FIG.10*
(a)
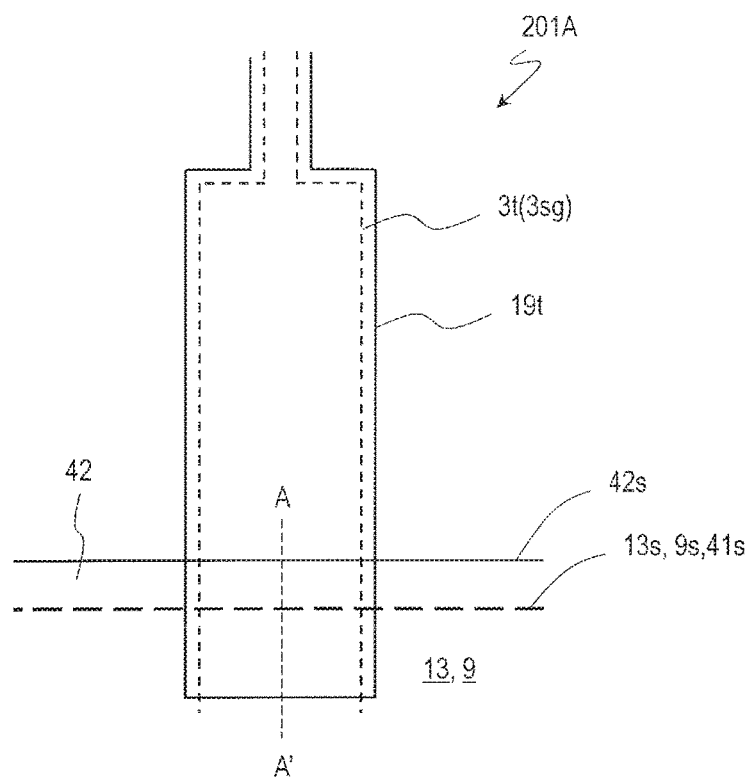
(b)
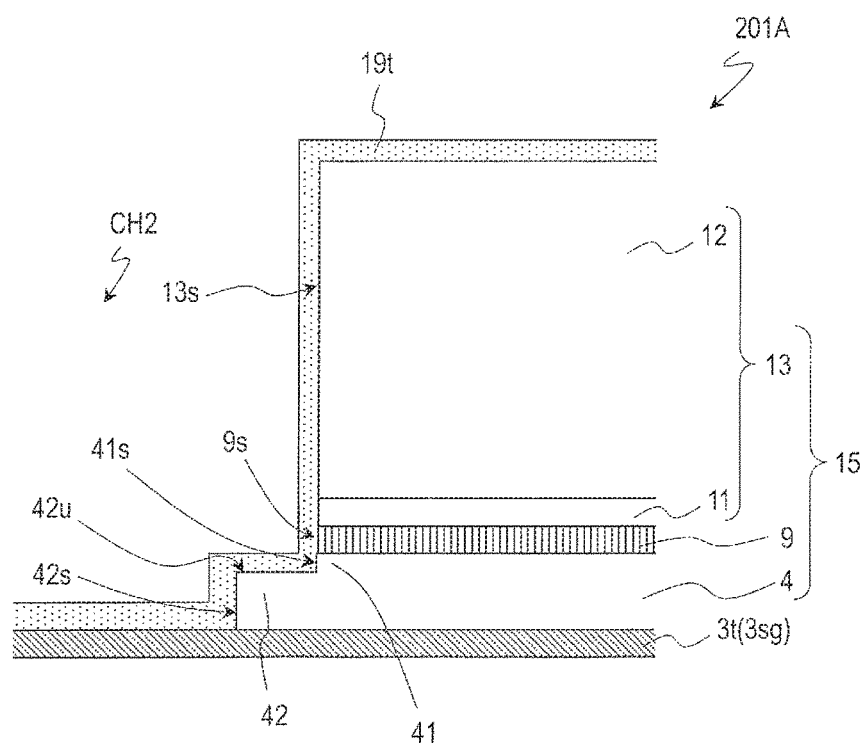

FIG.12
(a)
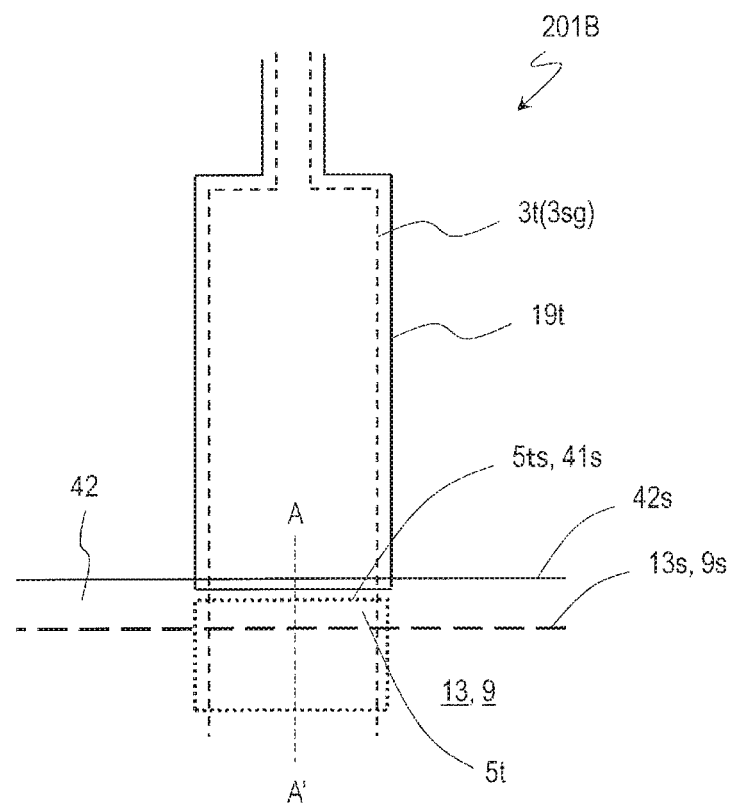
(b)
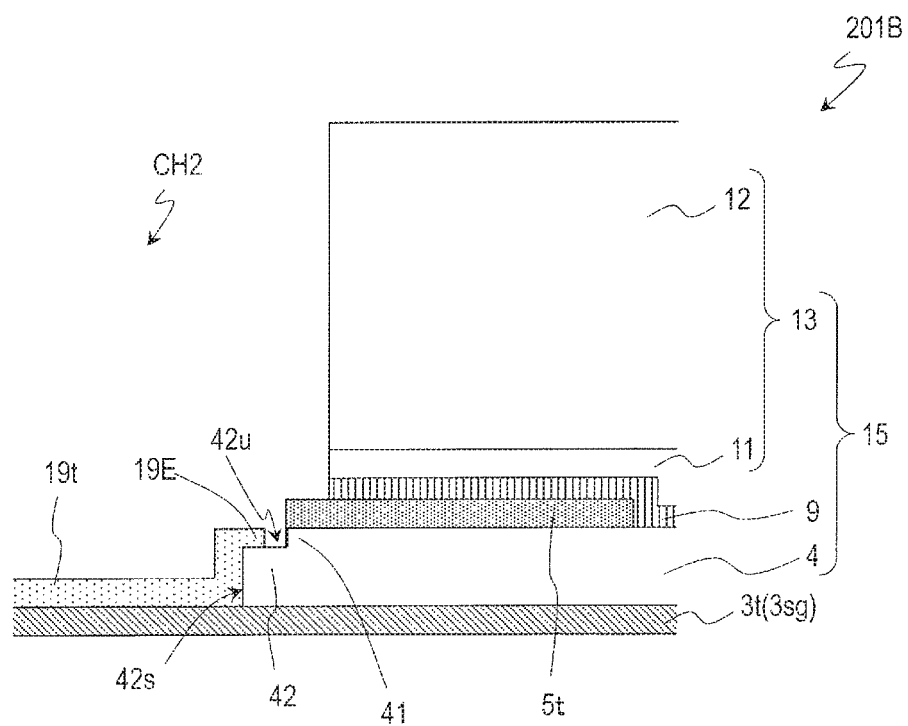

FIG. 13
(a)
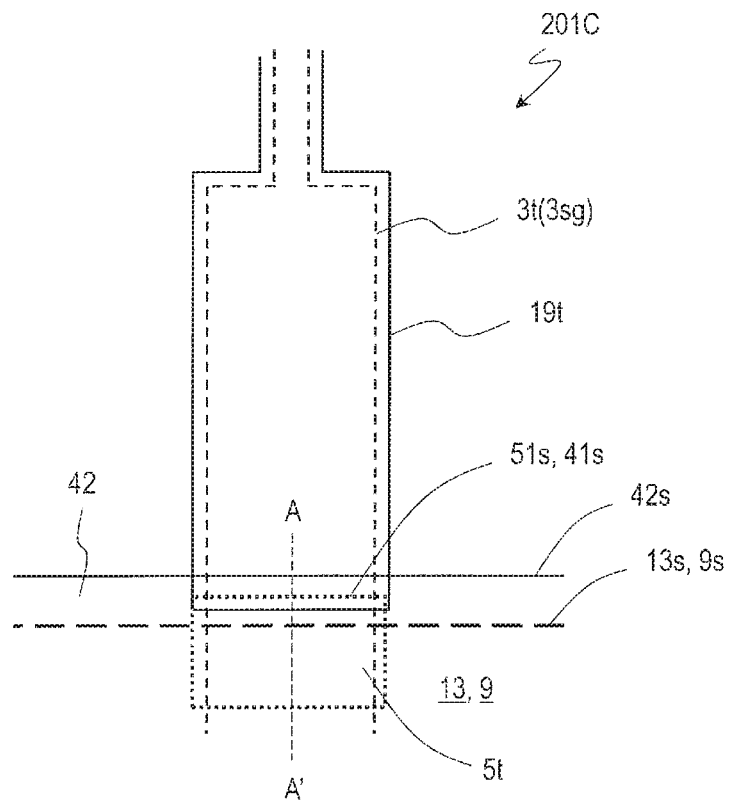
(b)
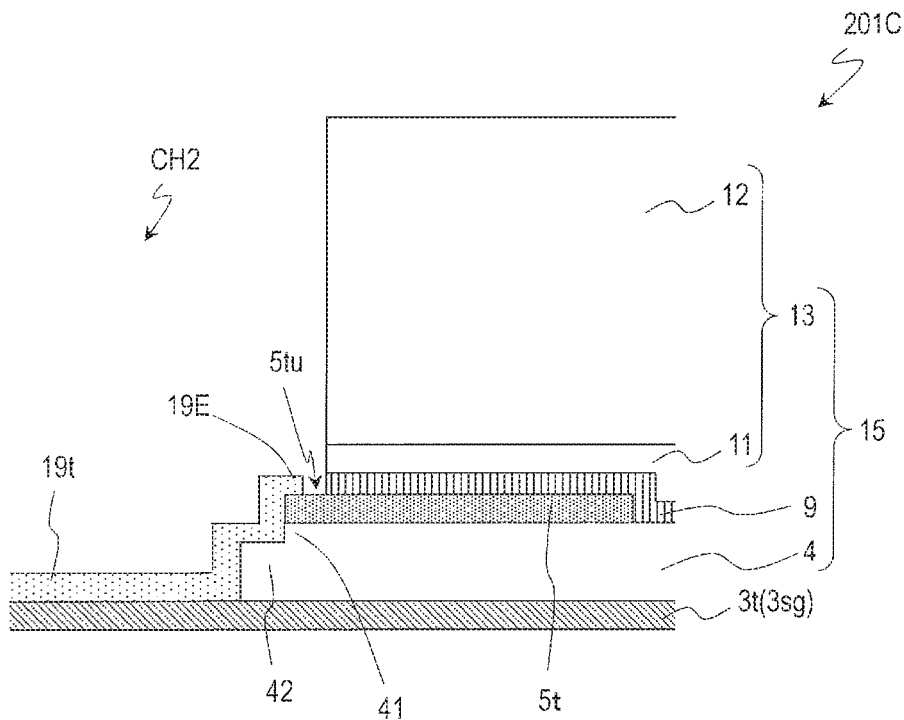

FIG.14
(a)
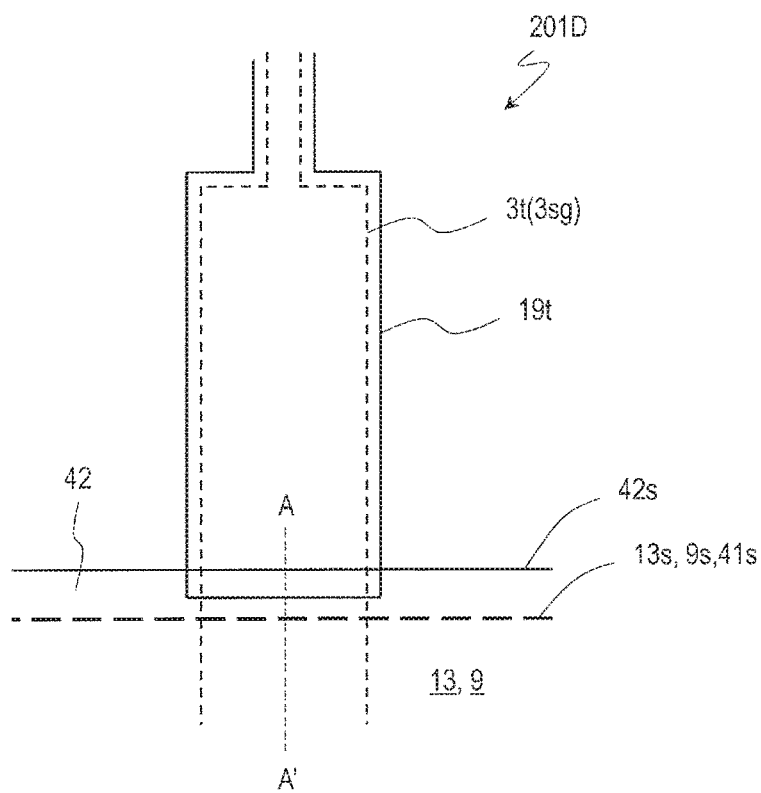
(b)
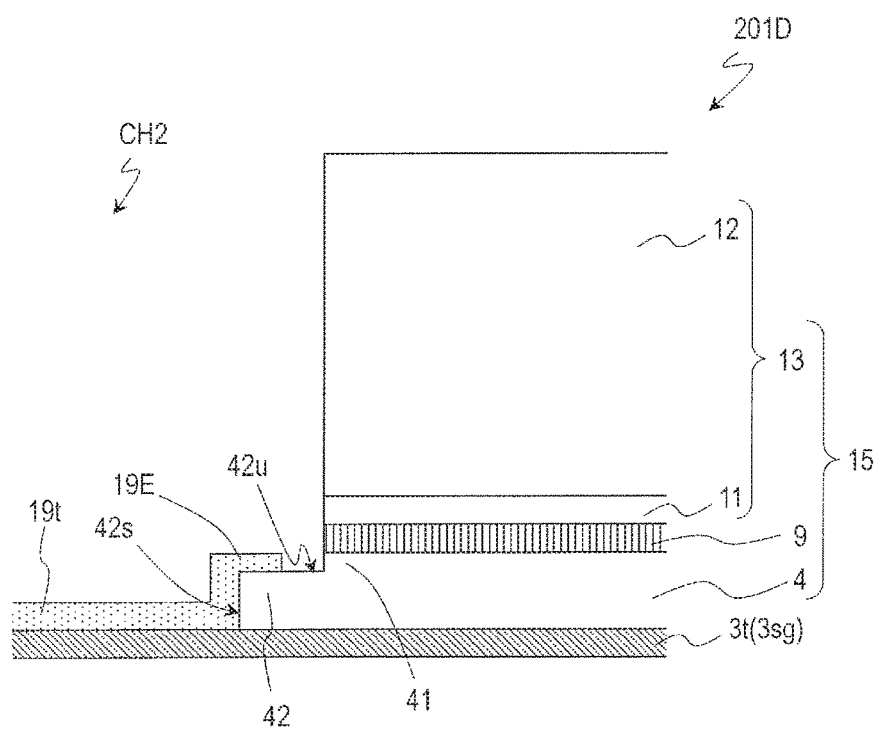

SEMICONDUCTOR DEVICE INCLUDING MARK PORTION AND PRODUCTION METHOD FOR SAME

TECHNICAL FIELD

The present invention relates to a semiconductor device formed with the use of an oxide semiconductor and a manufacturing method thereof.

BACKGROUND ART

An active matrix substrate for use in a liquid crystal display device or the like includes a switching element, such as a thin film transistor (hereinafter, "TFT"), in each pixel. As such a switching element, a TFT which includes an amorphous silicon film as the active layer (hereinafter, "amorphous silicon TFT") and a TFT which includes a polycrystalline silicon film as the active layer (hereinafter, "polycrystalline silicon TFT") have been widely used in conventional devices.

Active matrix substrates usually have a display region which includes a plurality of pixels and a region exclusive of the display region (peripheral region). Each pixel of the display region includes a source wire extending in a column direction of the pixels, a gate wire extending in a row direction of the pixels, a pixel electrode, and a TFT. In the peripheral region, a plurality of terminal portions are provided for connecting the gate wires or source wires to external wires. For example, the gate wires extend from the display region to the peripheral region and are connected with a gate driver via the terminal portions (gate terminals). Meanwhile, the source wires are, for example, electrically coupled with gate connecting wires formed out of a same film as the gate wires. This connecting portion is referred to as "source-gate connecting portion". The gate connecting wires are connected with a source driver via the terminal portions (source terminals) in the peripheral region. Wires, such as gate wires, source wires, and gate connecting wires, are metal wires, for example. In this specification, structures for connecting wires with each other, such as gate terminal portions, source terminal portions, and source-gate connecting portions, are generically referred to as "wire connecting portions".

In recent years, using an oxide semiconductor as a material of the active layer of TFTs, instead of amorphous silicon and polycrystalline silicon, has been proposed. Such TFTs are referred to as "oxide semiconductor TFTs". The oxide semiconductor has higher mobility than the amorphous silicon. Therefore, oxide semiconductor TFTs are capable of higher speed operation than amorphous silicon TFTs. Further, oxide semiconductor films can be formed through a simpler and more convenient process than polycrystalline silicon films and are therefore applicable to devices which require large surfaces.

As an oxide semiconductor TFT, a structure which has, for example, a bottom gate configuration and in which a protection layer (etch stop layer) is arranged so as to cover a channel region of an oxide semiconductor layer has been proposed. Such a structure is referred to as "channel protection type (or etch stop type)". In a manufacturing process of an etch stop type TFT, source/drain electrodes are formed after a protection layer is formed on an oxide semiconductor layer. Thus, in etching for formation of the source/drain electrodes (source/drain separation), the protection layer functions as an etch stop, so that damage to the channel region from the etching can be reduced.

For an active matrix substrate which includes etch stop type oxide semiconductor TFTs, the step of forming a protection layer is added. Various processes for manufacture of such an active matrix substrate with a reduced number of photomasks have been studied (e.g., Patent Document 1).

CITATION LIST

Patent Literature

Patent Document 1: WO 2011-070981

SUMMARY OF INVENTION

Technical Problem

In conventional active matrix substrates, corrosion sometimes occurred in metal wires, such as gate wires, source wires, and gate connecting wires, in the wire connecting portion. Details will be described later.

Embodiments of the present invention were conceived in view of the above circumstances. One of the objects of the present invention is to provide a novel wire connection structure which is capable of suppressing corrosion of wires in a semiconductor device which includes oxide semiconductor TFTs.

Solution to Problem

A semiconductor device according to one embodiment of the present invention includes: a substrate; a thin film transistor supported by the substrate; an interlayer insulating layer covering the thin film transistor; and a wire connecting portion, wherein the thin film transistor includes a gate electrode provided on the substrate, a gate insulating layer covering the gate electrode, an oxide semiconductor layer provided on the gate insulating layer, a protection layer covering at least a channel region of the oxide semiconductor layer, and a source electrode and a drain electrode, each of which is in contact with the oxide semiconductor layer, the wire connecting portion includes a lower electrically-conductive portion formed out of a same electrically-conductive film as the gate electrode, an insulating layer which is provided on the lower electrically-conductive portion and which has a contact hole through which at least a part of the lower electrically-conductive portion is exposed, and an upper electrically-conductive portion, at least a part of which is provided inside the contact hole, the insulating layer includes the gate insulating layer, the protection layer and the interlayer insulating layer, at a lateral wall of the contact hole, the gate insulating layer includes an upper portion and a lower portion which is present on the substrate side of the upper portion, and when viewed in a normal direction of the substrate, a lateral surface of the lower portion juts out from a lateral surface of the upper portion, and the upper electrically-conductive portion is in contact with the lower electrically-conductive portion and the lateral surface and an upper surface of the lower portion of the gate insulating layer inside the contact hole.

In one embodiment, the wire connecting portion includes an oxide semiconductor connecting portion located between the protection layer and the gate insulating layer and formed out of a same semiconductor film as the oxide semiconductor layer, when viewed in the normal direction of the substrate, at the lateral wall of the contact hole, a lateral surface of the oxide semiconductor connecting portion is present between a lateral surface of the protection layer and the lateral surface of the lower portion of the gate insulating layer, and the upper electrically-conductive portion inside the contact hole is further in contact with the lateral surface of the upper portion of the gate insulating layer and with the lateral surface and an upper surface of the oxide semiconductor connecting portion.

In one embodiment, at the lateral wall of the contact hole, the lateral surface of the upper portion of the gate insulating layer is in alignment with the lateral surface of the protection layer.

In one embodiment, at the lateral wall of the contact hole, the lateral surface of the upper portion of the gate insulating layer is in alignment with the lateral surface of the oxide semiconductor connecting portion.

In one embodiment, the upper electrically-conductive portion extends from a bottom surface of the contact hole to an upper surface of the interlayer insulating layer across the lateral wall.

In one embodiment, the upper electrically-conductive portion includes an end portion on the upper surface of the lower portion of the gate insulating layer.

In one embodiment, the upper electrically-conductive portion includes an end portion on the upper surface of the oxide semiconductor connecting portion.

In one embodiment, the wire connecting portion further includes a source connecting portion which is present between the protection layer and the interlayer insulating layer and which is formed out of a same electrically-conductive film as the source electrode, when viewed in the normal direction of the substrate, at the lateral wall of the contact hole, a lateral surface of the source connecting portion lies inward of the lateral surface of the lower portion of the gate insulating layer, and the upper electrically-conductive portion inside the contact hole is further in contact with the lateral surface of the upper portion of the gate insulating layer, the lateral surface of the protection layer, and the lateral surface and an upper surface of the source connecting portion.

In one embodiment, the lateral surface of the source connecting portion is in alignment with the lateral surface of the protection layer and the lateral surface of the upper portion of the gate insulating layer.

In one embodiment, the semiconductor device includes: a mark portion formed out of a same electrically-conductive film as the gate electrode; an island-like insulating film covering the mark portion; an oxide semiconductor cover portion formed out of a same semiconductor film as the oxide semiconductor layer and arranged so as to at least partially overlap the mark portion with the insulating film interposed therebetween; and an upper electrical conductor cover portion covering the oxide semiconductor cover portion, wherein at a periphery of the insulating film, the insulating film includes another upper portion and another lower portion which is present on the substrate side of the another upper portion, a lateral surface of the another lower portion jutting out from a lateral surface of the another upper portion when viewed in the normal direction of the substrate, the lateral surface of the another upper portion is in alignment with a lateral surface of the oxide semiconductor cover portion, and the upper electrical conductor cover portion is arranged so as to be in contact with the lateral surface and an upper surface of the another lower portion, the lateral surface of the another upper portion, and the lateral surface and an upper surface of the oxide semiconductor cover portion.

In one embodiment, when viewed in the normal direction of the substrate, at the lateral wall of the contact hole, a distance D between the lateral surface of the upper portion of the gate insulating layer and the lateral surface of the lower portion of the gate insulating layer is not less than 1 µm and not more than 10 µm.

In one embodiment, when viewed in the normal direction of the substrate, at the lateral wall of the contact hole, a distance dl between the lateral surface of the protection layer and the lateral surface of the oxide semiconductor connecting portion is greater than a distance D between the lateral surface of the upper portion and the lateral surface of the lower portion.

In one embodiment, the oxide semiconductor layer includes an In—Ga—Zn—O based semiconductor.

In one embodiment, the oxide semiconductor layer includes a crystalline portion.

A semiconductor device manufacturing method according to one embodiment of the present invention is a method for manufacturing a semiconductor device which includes a thin film transistor and a wire connecting portion, the method including: (A) forming a gate conductive film on a substrate and patterning the gate conductive film such that a gate electrode of the thin film transistor is formed in a TFT formation region in which the thin film transistor is to be formed and that a lower electrically-conductive portion of the wire connecting portion is formed in a wire connecting portion formation region in which the wire connecting portion is to be formed; (B) forming a gate insulating layer so as to cover the gate electrode and the lower electrically-conductive portion; (C) forming an oxide semiconductor film on the gate insulating layer and patterning the oxide semiconductor film, thereby forming an oxide semiconductor layer of the thin film transistor; (D) forming a protection layer on the oxide semiconductor layer and the gate insulating layer so as to cover at least a channel region of the oxide semiconductor layer, the protection layer also being extended over the wire connecting portion formation region, the protection layer having an opening overlapping part of the lower electrically-conductive portion when viewed in a normal direction of the substrate; (E) forming a source conductive film so as to cover the oxide semiconductor layer and patterning the source conductive film such that a source electrode and a drain electrode of the thin film transistor are formed, thereby obtaining the thin film transistor; (F) forming an interlayer insulating layer so as to cover the thin film transistor, the interlayer insulating layer also being extended over the wire connecting portion formation region, (G) etching the interlayer insulating layer, the protection layer and the gate insulating layer such that a contact hole is formed in the wire connecting portion formation region, through which part of the lower electrically-conductive portion is exposed, the etching being carried out under such a condition that an end portion of the protection layer and an upper portion of part of the gate insulating layer underlying the end portion of the protection layer are removed while a lower portion of the part of the gate insulating layer underlying the end portion of the protection layer remains, so that at a lateral wall of the contact hole, the gate insulating layer includes an upper portion and a lower portion which is present on the substrate side of the upper portion and has such a step structure that the lower portion juts out from the upper portion when viewed in the normal direction of the substrate; and (H) inside the contact hole, forming an upper electrically-conductive portion so as to be in contact with the part of the lower electrically-conductive portion and the lateral surface and an upper surface of the lower portion of the gate insulating layer, thereby obtaining the wire connecting portion.

In one embodiment, (C) includes patterning the oxide semiconductor film, thereby forming an island-like oxide semiconductor connecting portion in the wire connecting portion formation region, (D) includes forming the protection layer so as to cover the lateral surface and an upper surface of the oxide semiconductor connecting portion, (E) includes patterning the source conductive film under such a condition that the oxide semiconductor connecting portion functions as an etch stop, and when viewed in the normal direction of the substrate, at the lateral wall of the contact hole, the lateral surface of the oxide semiconductor connecting portion is present between the lateral surface of the protection layer and the lateral surface of the lower portion of the gate insulating layer.

In one embodiment, the interlayer insulating layer formed in (F) includes a first insulating layer which is an inorganic insulating layer and a second insulating layer which is an organic insulating layer formed on the first insulating layer, and (G) includes patterning the second insulating layer and etching together the first insulating layer, the protection layer and the gate insulating layer using the patterned second insulating layer as a mask.

Advantageous Effects of Invention

According to one embodiment of the present invention, a novel wire connection structure is provided which is capable of suppressing corrosion of wires in a semiconductor device which includes oxide semiconductor TFTs.

BRIEF DESCRIPTION OF DRAWINGS

FIGS. 3(a) and 3(b) are respectively a plan view and a cross-sectional view illustrating a terminal portion 201 in the semiconductor device of the first embodiment.

FIG. 4 is a cross-sectional view illustrating a source-gate connecting portion 203 in the semiconductor device of the first embodiment.

FIGS. 5(a) and 5(b) are respectively a cross-sectional view and a plan view showing an example of a mark portion 205 in the semiconductor device of the first embodiment.

FIGS. 10(a) and 10(b) are respectively a plan view and a cross-sectional view of a terminal portion 201A in a semiconductor device of the second embodiment.

FIGS. 12(a) and 12(b) are respectively a plan view and a cross-sectional view of a terminal portion 201B in a semiconductor device of the third embodiment.

FIGS. 13(a) and 13(b) are respectively a plan view and a cross-sectional view of a terminal portion 201C in a semiconductor device of the third embodiment.

FIGS. 14(a) and 14(b) are respectively a plan view and a cross-sectional view of a terminal portion 201D in a semiconductor device of the third embodiment.

DESCRIPTION OF EMBODIMENTS

A configuration of a wire connecting portion of an active matrix substrate which includes etch stop type oxide semiconductor TFTs is disclosed in, for example, Patent Document 1. In the wire connecting portion (gate terminal portion) of Patent Document 1, a gate wire and an upper wire formed out of the same film as a pixel electrode are connected with each other via an intermediate layer formed out of the same film as a source wire (a source conductive film).

However, in some active matrix substrate manufacturing processes, the source conductive film cannot be utilized for connection of the gate wire and the upper wire. In such a case, for example, the upper wire is arranged so as to be in direct contact with the gate wire inside a contact hole.

The present inventor carried out research and found that, in a wire connection structure where the upper wire and the gate wire are in direct contact with each other inside the contact hole, the coverage of the upper wire decreases as the depth of the contact hole increases, and as a result, there is a probability that corrosion of the gate wire (metal) occurs. Particularly when a relatively thick flattening film is provided in a terminal portion formation region, the contact hole is deeper so that the above problem is more critical.

In view of such, the present inventor found that utilizing a protection layer (etch stop layer) of an oxide semiconductor TFT enables formation of a wire connection structure which is capable of suppressing corrosion of wires without increasing the number of photomasks used, and conceived the present invention.

(First Embodiment)

Hereinafter, the first embodiment of the semiconductor device of the present invention is described with reference to the drawings. The semiconductor device of the present embodiment includes an oxide semiconductor TFT and a wire connecting portion. Note that the semiconductor device of the present embodiment includes a wide variety of applications, such as active matrix substrates, various display devices, and electronic devices.

Figure 1:
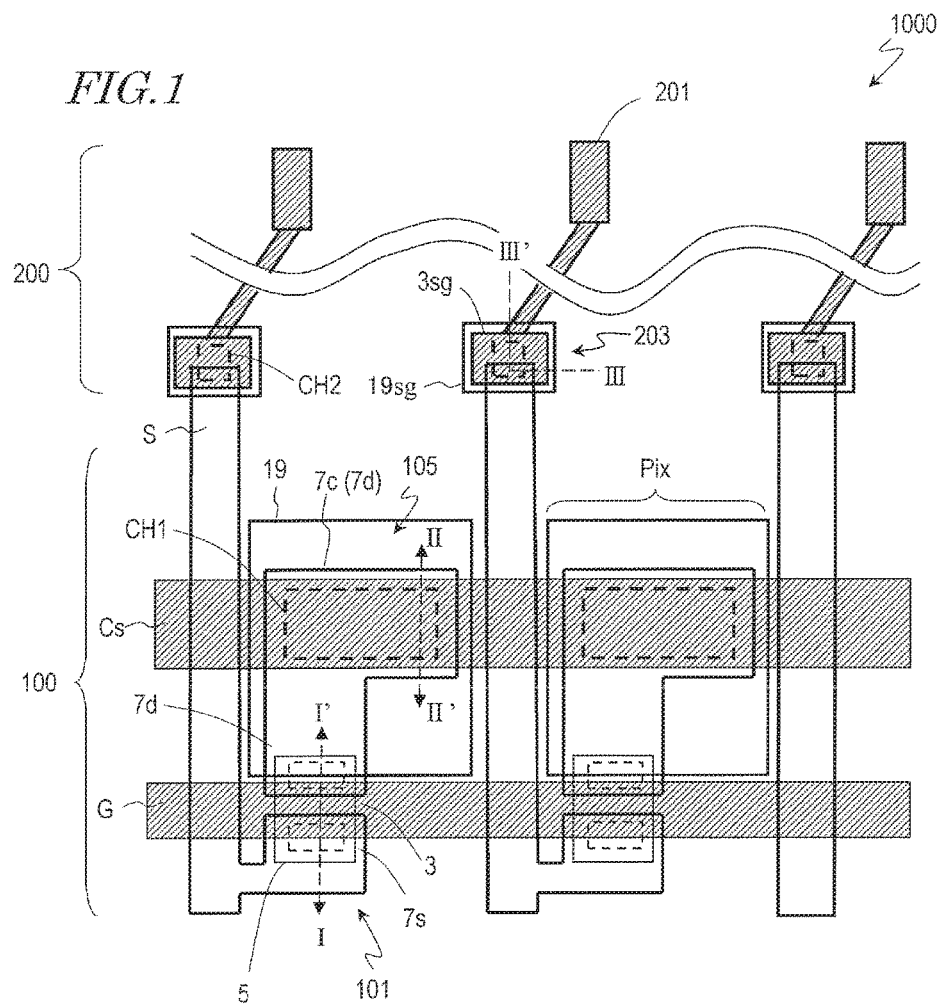
FIG. 1 is a schematic plan view illustrating part of a semiconductor device 1000 of the first embodiment.

FIG. 1 is a schematic plan view illustrating part of a semiconductor device 1000 of the present embodiment.

The semiconductor device 1000 of the present embodiment includes a display region 100, which includes a plurality of pixel regions Pix, and a non-display region 200 provided in a region exclusive of the display region.

In each of the pixel regions Pix, a source wire S extending in the column direction of pixels, a gate wire G extending in the row direction of pixels, an oxide semiconductor TFT (hereinafter, simply abbreviated as "TFT") 101, and a pixel electrode 19 are provided. A capacitance wire Cs and a storage capacitance 105 may be further provided. The gate wire G and the capacitance wire Cs are formed out of the same electrically-conductive film (gate conductive film). The TFT 101 is located near the intersection of the source wire S and the gate wire G. The storage capacitance 105 is provided above the capacitance wire Cs.

The TFT 101 includes an oxide semiconductor layer 5 which serves as the active layer. The oxide semiconductor layer 5 is connected with a source electrode 7s integrally formed with the source wire S and connected with a drain electrode 7d. The drain electrode 7d is connected with the pixel electrode 19. In this example, the drain electrode 7d is extended so as to overlie the capacitance wire Cs and functions as the upper electrode 7c of the storage capacitance 105. A contact hole CH1 for connection of the drain electrode 7d and the pixel electrode 19 is arranged so as to overlap the capacitance wire Cs when viewed in the normal direction of the substrate.

In the non-display region 200, wire connecting portions, including source-gate connecting portions 203 and terminal portions 201, are provided.

In the source-gate connecting portions 203, the source wire S is electrically coupled with a wire 3sg which is formed out of the gate conductive film (referred to as "gate connecting wire"). Herein, the source wire S and the gate connecting wire 3sg are electrically coupled together via a transparent connecting portion 19sg formed out of the same transparent electrically-conductive film as the pixel electrode. The transparent connecting portion 19sg is in contact with the source wire S and the gate connecting wire 3sg inside a contact hole CH2 formed in an insulating layer.

In the terminal portions 201, the gate wire G or the gate connecting wire 3sg is electrically coupled with an upper wire formed out of the same transparent electrically-conductive film as the pixel electrode. The upper wire is in contact with the gate wire G or the gate connecting wire 3sg inside a contact hole formed in the insulating layer.

Thus, the wire connecting portions include electrically-conductive portions provided under the insulating layer, such as the gate wire G and the gate connecting wire 3sg (hereinafter, generically referred to as "lower electrically-conductive portions"), the insulating layer which has a contact hole through which at least a part of the lower electrically-conductive portions is exposed, and electrically-conductive portions, such as the transparent connecting portion 19sg and the upper wire (hereinafter, generically referred to as "upper electrically-conductive portions"). As will be described later, the lateral wall of the contact hole has a predetermined step structure. The upper electrically-conductive portion is arranged so as to be in contact with the lower electrically-conductive portion inside the contact hole.

Figure 2:
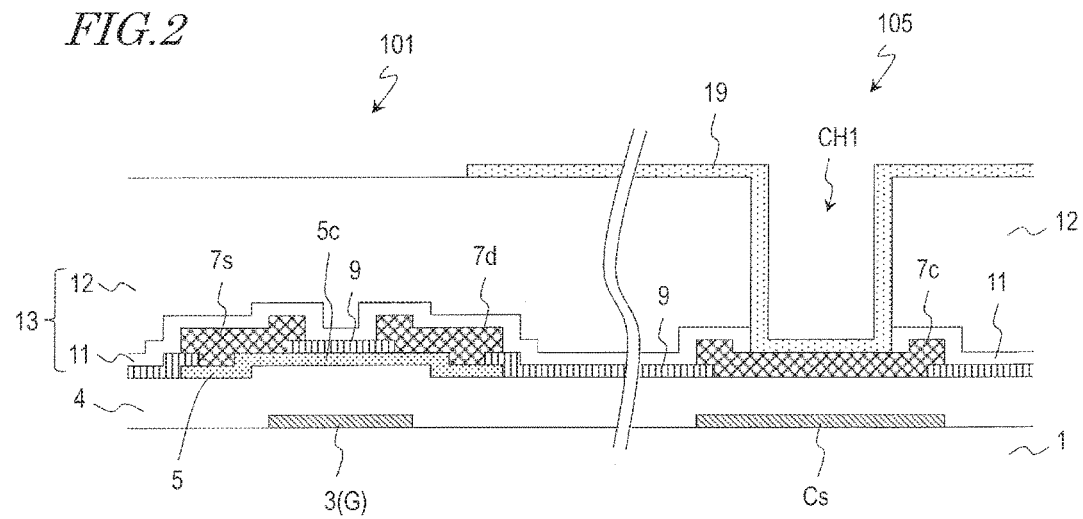
FIG. 2 is a cross-sectional view of a TFT 101 and a storage capacitance 105 in the semiconductor device of the first embodiment.

Next, the configuration of the oxide semiconductor TFT 101, the storage capacitance 105, the source-gate connecting portion 203 and the terminal portion 201 is described more specifically with reference to FIG. 2 to FIG. 4.

<TFT 101 and Storage Capacitance 105>

FIG. 2 is a cross-sectional view of the TFT 101 and the storage capacitance 105 of the semiconductor device 1000, showing cross sections taken along line I-I' and line II-II' of FIG. 1.

The oxide semiconductor TFT (hereinafter, simply abbreviated as "TFT") 101 is an etch stop type TFT. The TFT 101 includes a gate electrode 3 supported on a substrate 1, a gate insulating layer 4 covering the gate electrode 3, an oxide semiconductor layer 5 arranged so as to overlap the gate electrode 3 with the gate insulating layer 4 interposed therebetween, a protection layer 9 covering a channel region 5c of the oxide semiconductor layer 5, and a source electrode 7s and a drain electrode 7d. The gate electrode 3 may be integrally formed with the gate wire G. The source electrode 7s may be integrally formed with the source wire S. The oxide semiconductor layer 5 includes the channel region 5c, and a source contact region and a drain contact region which are located at opposite sides of the channel region. The source electrode 7s is arranged so as to be in contact with the source contact region via a source opening provided in the protection layer 9. Likewise, the drain electrode 7d is arranged so as to be in contact with the drain contact region via a drain opening provided in the protection layer 9. The source electrode 7s and the drain electrode 7d may be formed out of the same electrically-conductive film (source conductive film).

The storage capacitance 105 includes a capacitance wire Cs provided on the substrate 1 and an upper electrode 7c arranged so as to overlap the capacitance wire Cs with the gate insulating layer 4 interposed therebetween. The capacitance wire Cs is formed out of the gate conductive film. The upper electrode 7c is formed out of the source conductive film. Herein, the drain electrode 7d is extended so as to overlie the capacitance wire Cs and functions as the upper electrode 7c.

The TFT 101 and the storage capacitance 105 are covered with an interlayer insulating layer 13 provided on source and drain electrodes 7s, 7d. The interlayer insulating layer 13 may have a multilayer structure. For example, the interlayer insulating layer 13 may include, from the TFT 101 side, a first insulating layer (passivation film) 11 and a second insulating layer 12 which is greater in thickness than the first insulating layer. The first insulating layer 11 may be an inorganic insulating layer, e.g., a $SiO_2$ layer. The second insulating layer 12 may be an organic insulating layer. The second insulating layer 12 may be a flattening film.

The interlayer insulating layer 13 has a contact hole (or "pixel contact hole") CH1 which reaches the drain electrode 7d. The pixel electrode 19 is provided on the interlayer insulating layer 13 and in the pixel contact hole CH1 so as to be in direct contact with the drain electrode 7d inside the pixel contact hole CH1. The pixel contact hole CH1 may be provided above the capacitance wire Cs.

<Terminal Portion 201>

FIGS. 3(a) and 3(b) are respectively a plan view and a cross-sectional view illustrating the terminal portion 201.

The terminal portion 201 includes a lower connecting portion 3t formed out of the gate conductive film, an insulating layer 15 provided on the lower connecting portion 3t, and an upper connecting portion 19t formed out of the same transparent electrically-conductive film as the pixel electrode. The lower connecting portion 3t may be part of the gate wire G or may be the gate connecting wire 3sg electrically coupled with the source wire S via the source-gate connecting portion 203. The insulating layer 15 includes the gate insulating layer 4, the protection layer 9 and the interlayer insulating layer 13 which are extended to a region in which a terminal portion is to be formed (terminal portion formation region). The insulating layer 15 has a contact hole (hereinafter, "terminal portion contact hole") CH2 through which at least part of the lower connecting portion 3t is exposed. The upper connecting portion 19t is in contact with the lower connecting portion 3t inside the terminal portion contact hole CH2.

Figure 15:
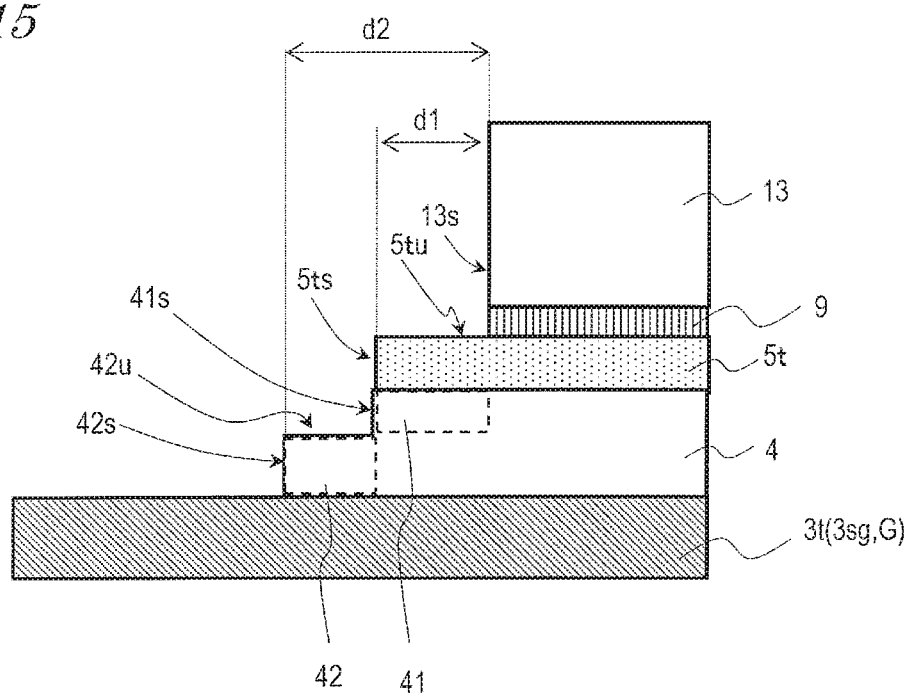
FIG. 15 is an enlarged cross-sectional view for illustrating a step structure of a gate insulating layer in the semiconductor device of the first embodiment.

In the present embodiment, the gate insulating layer 4 has a step at the lateral wall of the terminal portion contact hole CH2. FIG. 15 is an enlarged cross-sectional view for illustrating the step of the gate insulating layer 4. As shown in FIG. 15, the gate insulating layer 4 includes an upper portion 41 and a lower portion 42 which is closer to the substrate than the upper portion 41. The lateral surface 42s of the lower portion 42 juts out from the lateral surface 41s of the upper portion 41. Herein, "jutting out" means having a greater distance from the lateral surface 13s of the interlayer insulating layer 13 when viewed in the normal direction of the substrate. That is, the distance d2 between the lateral surface 42s of the lower portion 42 and the lateral surface 13s of the interlayer insulating layer 13 is greater than the distance d1 between the lateral surface 41s of the upper portion 41 and the lateral surface 13s of the interlayer insulating layer 13. Therefore, when the terminal portion contact hole CH2 is viewed in the normal direction of the substrate, the upper surface 42u of the lower portion 42 extends beyond the upper portion 41. Meanwhile, the lateral surface 42s of the lower portion 42 and the lateral surface 41s of the upper portion 41 are not in alignment with each other in the thickness direction. The lateral surface 42s and the upper surface 42u of the lower portion 42 and the lateral surface 41s of the upper portion 41 form some parts of the lateral wall of the terminal portion contact hole CH2. Such a structure (hereinafter, referred to as "step structure") can be formed, as will be described later, by etching with the utilization of the protection layer 9 without increasing the number of masks.

In the present embodiment, an island-like oxide semiconductor connecting portion 5t is provided between the gate insulating layer 4 and the protection layer 9. The oxide semiconductor connecting portion 5t is formed out of the same semiconductor film as the oxide semiconductor layer 5 of the TFT 101. The protection layer 9 has an opening through which end portions of the lower connecting portion 3t, the lower portion 42 of the gate insulating layer 4 and the oxide semiconductor connecting portion 5t are exposed.

At the lateral wall of the terminal portion contact hole CH2, the lateral surface (end surface) 5ts of the oxide semiconductor connecting portion 5t may be present between the lateral surface 42s of the lower portion 42 of the gate insulating layer 4 and the lateral surface 9s of the protection layer 9 when viewed in the normal direction of the substrate. The lateral surface 5ts of the oxide semiconductor connecting portion 5t may be in alignment with the lateral surface 41s of the upper portion 41 of the gate insulating layer 4. The lateral surface 9s of the protection layer 9 may be in alignment with the lateral surface 13s of the interlayer insulating layer 13. In such a configuration, when the terminal portion contact hole CH2 is viewed in the normal direction of the substrate, an end portion of the oxide semiconductor connecting portion 5t extends beyond the protection layer 9 and the interlayer insulating layer 13, and the lower portion 42 of the gate insulating layer 4 extends beyond the end portion of the oxide semiconductor connecting portion 5t. Therefore, at the lateral wall of the terminal portion contact hole CH2, another step is formed by the oxide semiconductor connecting portion 5t, the protection layer 9 and the interlayer insulating layer 13 in addition to the step of the gate insulating layer 4 (two-step structure). The lateral wall of the terminal portion contact hole CH2 has a stepped shape where the first step is formed by the lower portion 42 of the gate insulating layer 4, and the second step is formed by the upper portion 41 of the gate insulating layer 4 and the end portion of the oxide semiconductor connecting portion 5t.

In this specification, the condition that "lateral surfaces (of two or more different layers) are in alignment with each other" in a contact hole includes not only a configuration where the lateral surfaces of these layers which are exposed inside the contact hole are coplanar in the vertical direction but also a configuration where the lateral surfaces continuously form a slope surface, such as a tapered shape. Such a configuration can be realized by, for example, etching these layers using the same mask or using one layer as a mask in etching the other layer.

The upper connecting portion 19t extends from the bottom surface of the terminal portion contact hole CH2 to the upper surface of the interlayer insulating layer 13 across the lateral wall. Herein, inside the terminal portion contact hole CH2, the upper connecting portion 19t is arranged so as to cover the lower connecting portion 3t, the lateral surface 42s and the upper surface 42u of the lower portion 42 of the gate insulating layer 4, the lateral surface 41s of the upper portion 41 of the gate insulating layer 4, the lateral surface 5ts and the upper surface 5tu of the oxide semiconductor connecting portion 5t, the lateral surface 9s of the protection layer 9, and the lateral surface 13s of the interlayer insulating layer 13. Note that the upper connecting portion 19t only needs to be arranged so as to at least cover the lower connecting portion 3t, the lateral surface 42s of the lower portion 42, and at least part of the upper surface 42u of the lower portion 42.

In the terminal portion 201 of the present embodiment, the lateral wall of the terminal portion contact hole CH2 has a tapered shape realized by the above-described step structure. Thus, the coverage of the upper connecting portion 19t can be improved, so that corrosion of the lower connecting portion 3t can be suppressed. Particularly in the illustrated example, another step is formed in the oxide semiconductor connecting portion 5t and the protection layer 9 in addition to the step of the gate insulating layer 4 (two-step structure), so that the coverage can be improved more effectively.

Further, since the lower connecting portion 3t is covered not only with the gate insulating layer 4 but also with the oxide semiconductor connecting portion 5t and the protection layer 9, corrosion of the lower connecting portion 3t due to moisture can be suppressed more effectively.

The semiconductor device of the present embodiment only needs to include at least one wire connecting portion which has the above-described configuration.

<Source-Gate Connecting Portion 203>

FIG. 4 is a cross-sectional view of the source-gate connecting portion 203, showing a cross section taken along line III-III' of FIG. 1.

The source-gate connecting portion 203 includes the gate connecting wire 3sg formed out of the gate conductive film, the insulating layer 15 provided on the gate connecting wire 3sg, a source connecting wire 7sg formed out of the source conductive film, and the transparent connecting portion 19sg formed out of the same transparent electrically-conductive film as the pixel electrode. The source connecting wire 7sg is part of the source wire S. The gate connecting wire 3sg is electrically insulated from the gate wire G. The insulating layer 15 includes the gate insulating layer 4, the protection layer 9 and the interlayer insulating layer 13. The insulating layer 15 has a contact hole (hereinafter, "S-G contact hole") CH3 through which at least part of the gate connecting wire 3sg and at least part of the source connecting wire 7sg are exposed. That is, the S-G contact hole CH3 includes a gate side contact hole which is formed in the gate insulating layer 4, the protection layer 9 and the interlayer insulating layer 13 so as to reach the gate connecting wire 3sg and a source side contact hole which is formed in the interlayer insulating layer 13 so as to reach the source connecting wire 7sg. The transparent connecting portion 19sg is in contact with both the gate connecting wire 3sg and the source connecting wire 7sg inside the S-G contact hole CH3. Thus, the gate connecting wire 3sg and the source connecting wire 7sg are coupled via the transparent connecting portion 19sg.

In the present embodiment, at the lateral wall of the S-G contact hole CH3 (the lateral wall of the gate side contact hole), the gate insulating layer 4 has a step structure which is similar to that previously described with reference to FIG. 3. That is, the gate insulating layer 4 includes the upper portion 41 and the lower portion 42 which is present on the substrate side of the upper portion 41. The lateral surface 42s of the lower portion 42 juts out from the lateral surface 41s of the upper portion 41. The lateral surface 42s and the upper surface 42u of the lower portion 42 and the lateral surface 41s of the upper portion 41 form some parts of the lateral wall of the S-G contact hole CH3. The protection layer 9 has an opening through which part of the gate connecting wire 3sg and the lower portion 42 of the gate insulating layer 4 are exposed. When viewed in the normal direction of the substrate, the lateral surface of the source connecting wire 7sg lies inward of the lateral surface of the lower portion 42 of the gate insulating layer 4. In this example, the lateral surface 9s of the protection layer 9 and the lateral surface 41s of the upper portion 41 of the gate insulating layer 4 are in alignment with an end surface of the source connecting wire 7sg.

The transparent connecting portion 19sg is arranged inside the S-G contact hole CH3 so as to cover the gate connecting wire 3sg, the lateral surface 42s and the upper surface 42u of the lower portion 42 of the gate insulating layer 4, the lateral surface 41s of the upper portion 41 of the gate insulating layer 4, the lateral surface 9s of the protection layer 9, the lateral surface and the upper surface of the source connecting wire 7sg, and the lateral surface of the interlayer insulating layer 13. Note that the transparent connecting portion 19sg only needs to be arranged so as to at least cover the gate connecting wire 3sg, the step structure of the gate insulating layer 4, and the source connecting wire 7sg.

Also in the source-gate connecting portion 203, the lateral wall of the S-G contact hole CH3 has the above-described step structure as in the terminal portion 201. Therefore, the coverage of the transparent connecting portion 19sg can be improved, so that corrosion of the gate connecting wire 3sg can be suppressed.

<Mark Portion 205>

In the non-display region 200, predetermined marks can be formed. Examples of the marks include a mark for alignment of a TFT substrate and a counter substrate, a mark for measurement of the displacement between the TFT substrate and the counter substrate, and a mark for measurement of the displacement of a separation line in separation of a glass substrate. The above-described marks can be formed of the same material as the gate wire G.

In the case where the above-described marks are located so as to overlap a seal material in order to narrow the non-display region 200, an interlayer insulating layer overlying the marks is removed. However, if the marks are not covered with the interlayer insulating layer but only with, for example, a gate insulating layer, a pinhole or crack in the gate insulating film can disadvantageously allow the marks to be etched with an etchant so that the marks can have defects or disappear. In view of such, in some cases, a mark cover is provided so as to cover the marks. In this specification, a portion which includes a mark and a mark cover is referred to as "mark portion".

FIGS. 5(a) and 5(b) are a cross-sectional view and a plan view showing an example of a mark portion 205 in the semiconductor device of the present embodiment.

The mark portion 205 includes an island-like mark 3m which is formed using the gate conductive film, a gate insulating layer 4 covering the mark 3m, and a mark cover 21 provided on the gate insulating layer 4. The planar shape of the mark 3m may be, for example, rectangular, cruciform, etc. The mark cover 21 includes an island-like oxide semiconductor cover 5m and an island-like transparent electrical conductor cover 19m provided on the oxide semiconductor cover 5m. The oxide semiconductor cover 5m is formed out of the same semiconductor film as the oxide semiconductor layer 5. The transparent electrical conductor cover 19m is formed out of the same transparent electrically-conductive film as the pixel electrode 19.

In the present embodiment, the gate insulating layer 4 is patterned in the shape of an island so as to cover the mark 3m. The lateral surface (end surface) of the gate insulating layer 4 has the above-described step structure. That is, the gate insulating layer 4 includes the upper portion 41 and the lower portion 42 that is present on the substrate side of the upper portion 41. The lateral surface 42s of the lower portion 42 juts out from the lateral surface 41s of the upper portion 41. The oxide semiconductor cover 5m is provided on the upper surface of the gate insulating layer 4. The lateral surface of the oxide semiconductor cover 5m may be in alignment with the lateral surface of the upper portion 41. The transparent electrical conductor cover 19m is arranged so as to cover the lateral surface 42s and the upper surface of the lower portion 42 of the gate insulating layer 4, the lateral surface of the upper portion 41 of the gate insulating layer 4, and the lateral surface and the upper surface of the oxide semiconductor cover 5m.

Such a configuration enables formation of a mark cover 21 which has excellent coverage, so that defects in or disappearance of the mark 3m and corrosion of the mark 3m can be prevented.

<Manufacturing Method of Semiconductor Device 1000>

Next, a method for manufacturing the semiconductor device 1000 is described. In a process illustrated herein, six photomasks are used.

Figure 8:
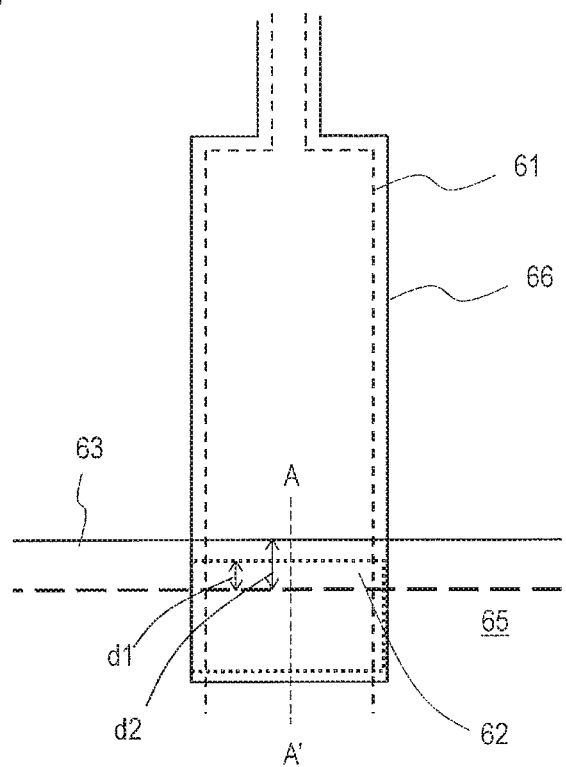
FIG. 8 is a diagram illustrating a pattern of a photomask in a terminal portion formation region 34.

FIGS. 6(a) to 6(d) and FIGS. 7(a) to 7(c) are schematic cross-sectional views for describing a manufacturing method of the semiconductor device 1000. Each diagram shows a TFT formation region 31 in which a TFT is to be formed, a capacitance formation region 32 in which a storage capacitance is to be formed, a source-gate connecting portion formation region 33 in which a source-gate connecting portion is to be formed, a terminal portion formation region 34 in which a terminal portion is to be formed, and a mark formation region 35 in which an alignment mark is to be formed. The pattern of a photomask in the terminal portion formation region 34 is illustrated in FIG. 8. In the present embodiment, the source-gate connecting portion formation region 33 and the terminal portion formation region 34 are also generically referred to as "wire connecting portion formation regions".

First, as shown in FIG. 3(a), a gate wire layer including the gate wire G is formed on the substrate 1. Specifically, a gate electrode 3 is formed in the TFT formation region 31, a capacitance wire Cs is formed in the capacitance formation region 32, a gate connecting wire 3sg is formed in the source-gate connecting portion formation region 33, a lower connecting portion 3t is formed in the terminal portion formation region 34, and a mark 3m is formed in the mark formation region 35. In patterning the gate conductive film, the first photomask 61 shown in FIG. 8 is used. The lower connecting portion 3t has, for example, a greater width than the gate wire G.

As the substrate 1, for example, a glass substrate, a silicon substrate, a heat-resistant plastic substrate (resin substrate), or the like, can be used.

The gate wire layer is realized by forming a gate conductive film (thickness: e.g., not less than 50 nm and not more than 500 nm) on the substrate 1 by, for example, sputtering and patterning the gate conductive film. As the gate conductive film, a film which includes a metal, such as aluminum (Al), tungsten (W), molybdenum (Mo), tantalum (Ta), chromium (Cr), titanium (Ti), copper (Cu), or the like, or an alloy thereof, or a metal nitride thereof, can be appropriately used. Alternatively, a multilayer film consisting of a plurality of such films may be used. Herein, as the gate conductive film, a multilayer film including, for example, a Ti film and a Cu film in this order is used.

Figure 6:
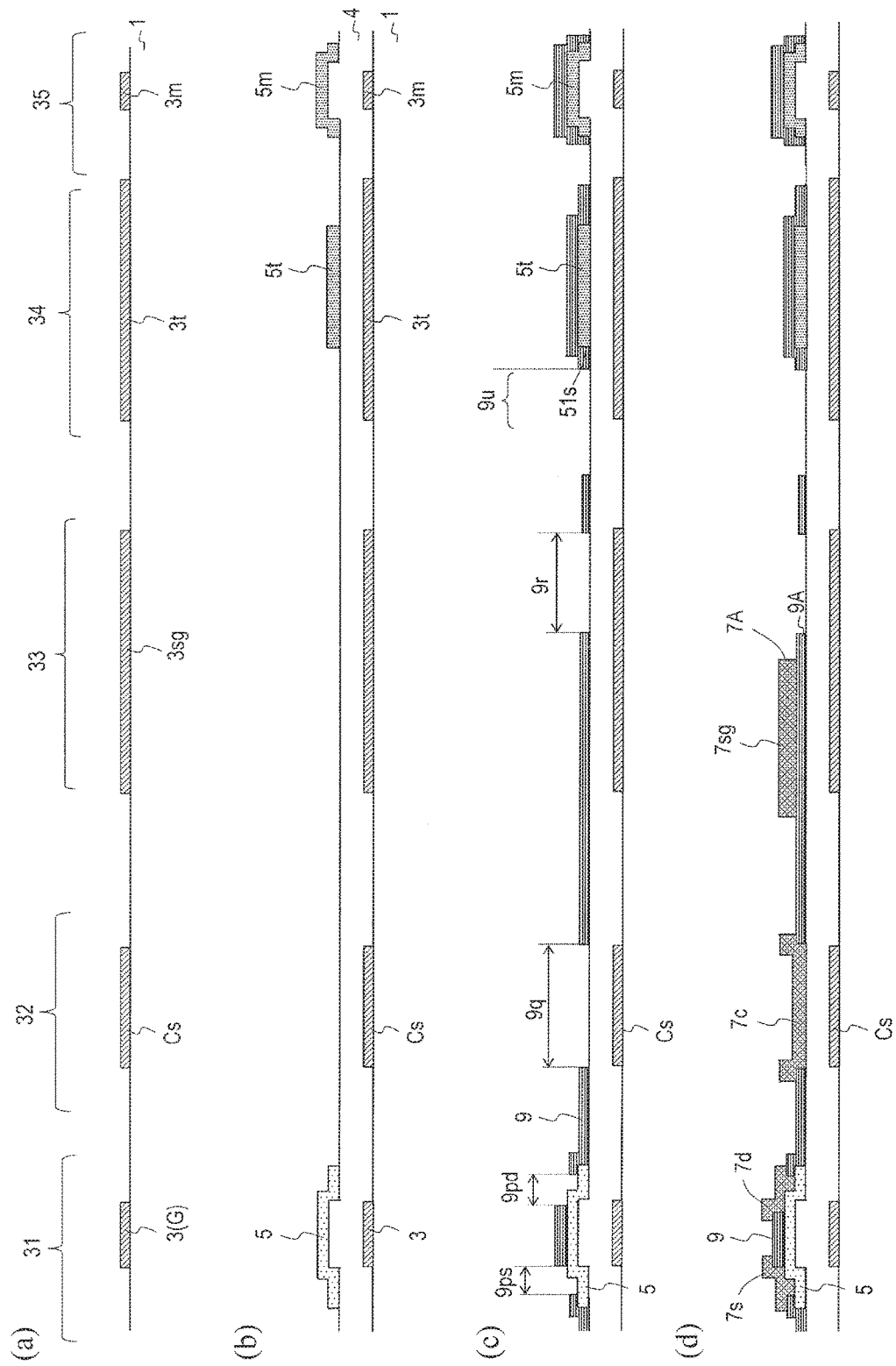
FIGS. 6(a) to 6(d) are schematic stepwise cross-sectional views for illustrating a manufacturing method of the semiconductor device 1000.
Figure 7:
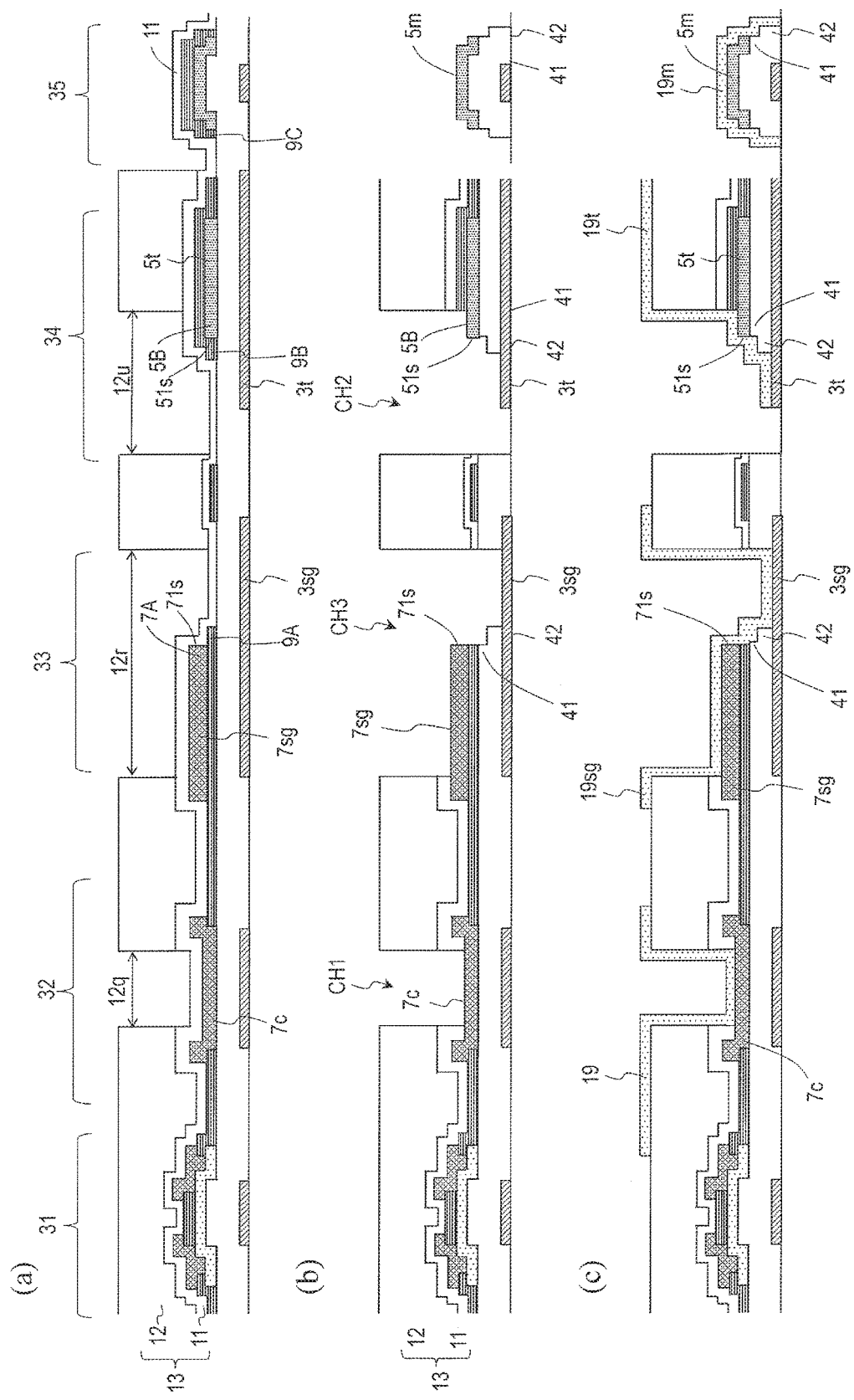
FIGS. 7(a) to 7(c) are schematic stepwise cross-sectional views for illustrating a manufacturing method of the semiconductor device 1000.

Subsequently, as shown in FIG. 6(*b*), a gate insulating layer 4 is formed so as to cover the gate wire layer. The gate insulating layer 4 can be formed by, for example, CVD. As the gate insulating layer 4, a silicon oxide (SiOx) layer, a silicon nitride ($SiN_x$) layer, a silicon oxide nitride (SiOxNy; x>y) layer, a silicon nitride oxide (SiNxOy; x>y) layer, or the like, can be appropriately used. The gate insulating layer 4 may have a multilayer structure. For example, the gate insulating layer 4 may be realized by forming a silicon nitride layer, a silicon nitride oxide layer, or the like, on the substrate side (lower layer) for preventing diffusion of impurities from the substrate 1 and forming a silicon oxide layer, a silicon oxide nitride layer, or the like, in a layer overlying the lower layer (upper layer) for securing insulation. Note that, when a layer which includes oxygen (e.g., an oxide layer such as $SiO_2$) is used as the uppermost layer of the gate insulating layer 4 (i.e., a layer which is in contact with the oxide semiconductor layer), oxygen deficiencies in the oxide semiconductor layer can be covered by oxygen from the oxide layer. Thus, the oxygen deficiencies in the oxide semiconductor layer can be effectively reduced. The thickness of the gate insulating layer 4 is arranged so as to be greater than the thickness of the protection layer 9 which will be described later. Due to such an arrangement, the step structure can be formed more assuredly. The thickness of the gate insulating layer 4 may be for example not less than twice, preferably not less than three times, the thickness of the protection layer 9. The thickness of the gate insulating layer 4 may be, for example, not less than 200 nm and not more than 500 nm. Herein, the gate insulating layer 4 is realized by forming, on the substrate 1, a SiNx layer having a thickness of not less than 200 nm and not more than 500 nm and a $SiO_2$ layer having a thickness of not less than 25 nm and not more than 100 nm in this order.

Then, an oxide semiconductor film is formed on the gate insulating layer 4, and the oxide semiconductor film (thickness: e.g., not less than 30 nm and not more than 200 nm) is patterned, whereby an oxide semiconductor layer 5 is formed in the TFT formation region 31, an oxide semiconductor connecting portion 5t is formed in the terminal portion formation region 34, and an oxide semiconductor cover 5m is formed in the mark formation region 35. The oxide semiconductor film may have a multilayer structure.

In patterning the oxide semiconductor film, the second photomask 62 shown in FIG. 8 is used. With this photomask, the island-like oxide semiconductor connecting portion 5t is formed so as to cover part of the lower connecting portion 3t with the gate insulating layer 4 interposed therebetween in the terminal portion formation region 34. The width of the oxide semiconductor connecting portion 5t is greater than the width of the lower connecting portion 3t. In the TFT formation region 31, the oxide semiconductor layer 5 is formed so as to at least partially overlap the gate electrode 3 with the gate insulating layer 4 interposed therebetween. In the mark formation region 35, the oxide semiconductor cover 5m is formed so as to cover the mark 3m with the gate insulating layer 4 interposed therebetween.

Then, as shown in FIG. 6(*c*), a protection layer 9 (thickness: e.g., not less than 30 nm and not more than 200 nm) is formed which serves as an etch stop layer (channel protection layer) of the TFT. As the protection layer 9, a silicon oxide (SiOx) layer, a silicon nitride ($SiN_x$) layer, a silicon oxide nitride (SiOxNy; x>y) layer, a silicon nitride oxide (SiNxOy; x>y) layer, or the like, can be appropriately used. Herein, a silicon oxide film ($SiO_2$ film) having a thickness of, e.g., 100 nm is formed by CVD as the protection layer 9.

Then, patterning of the protection layer 9 is carried out. By the patterning, a source opening 9ps and a drain opening 9pd are formed in the TFT formation region 31 such that the source contact region of the oxide semiconductor layer 5 is exposed through the source opening 9ps and the drain contact region of the oxide semiconductor layer 5 is exposed through the drain opening 9pd. In the capacitance formation region 32, an opening 9q is formed above part of the capacitance wire Cs. In the source-gate connecting portion formation region 33, an opening 9r is formed above part of the gate connecting wire 3sg. In the terminal portion formation region 34, an opening 9u is formed above part of the lower connecting portion 3t which is to form a contact region using the third photomask 63 shown in FIG. 8. As illustrated, in the terminal portion formation region 34, the protection layer 9 covers a lateral surface 51s of the oxide semiconductor connecting portion 5t on the contact region side (i.e., the end surface on the opening 9u side). That is, when viewed in the normal direction of the substrate 1, the lateral surface of the protection layer 9 (the lateral surface of the opening 9u) is at a position closer to the contact region side than the lateral surface 51s of the oxide semiconductor connecting portion 5t. In the mark formation region 35, the protection layer 9 is patterned so as to have an island-like pattern which covers the end surface and the upper surface of the oxide semiconductor cover 5m.

Thereafter, as shown in FIG. 6(*d*), a source conductive film (thickness: e.g., not less than 50 nm and not more than 500 nm) is formed on the substrate 1. Then, the source conductive film is patterned using the fourth photomask (not shown), whereby a source wire layer including a source wire is formed. Specifically, in the TFT formation region 31, a source electrode 7s is formed so as to be in contact with the oxide semiconductor layer 5 inside the source opening 9ps, and a drain electrode 7d is formed so as to be in contact with the oxide semiconductor layer 5 inside the drain opening 9pd, whereby a TFT 101 is obtained. In the capacitance formation region 32, an upper electrode 7c is formed so as to be in contact with the gate insulating layer 4 inside the opening 9q. The upper electrode 7c is integrally formed with the drain electrode 7d. Further, in the source-gate connecting portion formation region 33, a source connecting wire 7sg is formed on the protection layer 9. An end portion 7A of the source connecting wire 7sg on the opening 9r side is present at the upper surface of the protection layer 9. Therefore, as illustrated, a peripheral portion (end portion) 9A of the opening 9r in the protection layer 9 is exposed from the source connecting wire 7sg. In the terminal portion formation region 34 and the mark formation region 35, the source conductive film is removed.

As the source conductive film, a film which includes a metal, such as aluminum (Al), tungsten (W), molybdenum (Mo), tantalum (Ta), chromium (Cr), titanium (Ti), copper (Cu), or the like, or an alloy thereof, or a metal nitride thereof, can be appropriately used. Alternatively, a multilayer film consisting of a plurality of such films may be used. Herein, for example, a multilayer film (Cu/Ti) including a Ti film (thickness: 10-100 nm) and a Cu film (thickness: 50-400 nm) in this order from the substrate side is used.

Then, as shown in FIG. 7(a), an interlayer insulating layer 13 (thickness: e.g., not less than 1 μm and not more than 3 μm) is formed so as to cover the oxide semiconductor TFT 101. In this example, as the interlayer insulating layer 13, a multilayer film including a first insulating layer 11 and a second insulating layer 12 is formed by, for example, CVD. The first insulating layer 11 may be an inorganic insulating layer (thickness: e.g., not less than 0.1 μm and not more than 1 μm). The second insulating layer 12 may be an organic insulating layer (thickness: e.g., not less than 1 μm and not more than 4 μm).

An inorganic insulating film (passivation film), such as a silicon oxide (SiOx) film, a silicon nitride ($SiN_x$) film, a silicon oxide nitride (SiOxNy; x>y) film, a silicon nitride oxide (SiNxOy; x>y) film, or the like, can be used as the first insulating layer 11. The first insulating layer 11 may be a multilayer film. Herein, as the first insulating layer 11, a SiOx layer having a thickness of, e.g., not less than 100 nm and not more than 400 nm and a SiNx layer having a thickness of, e.g., not less than 20 nm and not more than 400 nm are formed sequentially in this order by, for example, CVD. As the second insulating layer 12, an organic insulating film including an organic insulative material, such as a photosensitive resin material, may be formed. Herein, a positive photosensitive resin film having a thickness of, e.g., 2000 nm is used as the second insulating layer 12.

Thereafter, patterning of the second insulating layer 12 is carried out. Thereby, in the capacitance formation region 32, an opening 12q is formed in the second insulating layer 12. The opening 12q is arranged so as to overlap at least part of the upper electrode 7c. Also, an opening 12r is formed in the source-gate connecting portion formation region 33. The opening 12r is arranged so as to overlap at least part of the upper surface of the source connecting wire 7sg (including the end portion 7A), the end portion (peripheral portion) 9A of the protection layer 9, and part of the gate connecting wire 3sg underlying the opening 9r. In the terminal portion formation region 34, an opening 12u is formed using the fifth photomask 65 shown in FIG. 8. The opening 12u is arranged so as to overlap at least part of the lower connecting portion 3t, the end portion 9B of the protection layer 9, and the end portion 5B of the oxide semiconductor connecting portion 5t. The second insulating layer 12 is removed from the mark formation region 35.

Subsequently, as shown in FIG. 7(b), the first insulating layer 11, the protection layer 9 and the gate insulating layer 4 are etched together using the second insulating layer 12 as an etching mask. Herein, the etching conditions are selected according to the materials of the insulating layers, etc., such that the inorganic insulating layers (the first insulating layer 11, the protection layer 9 and the gate insulating layer 4) are etched using the source conductive film and the oxide semiconductor film as the etch stop and that a step structure which will be described later is formed in the gate insulating layer 4. The etching conditions mentioned herein include, in the case of dry etching, the type of the etching gas, the substrate temperature, the vacuum degree in the chamber, etc. In the case of wet etching, the etching conditions include the type of the etching solution, the etching duration, etc. In the present embodiment, dry etching is carried out in a chamber using $CF_4/O_2$ as the etching gas.

By the above-described etching, the first insulating layer 11 is removed from the capacitance formation region 32 such that the upper electrode 7c (drain electrode 7d) is exposed.

In the source-gate connecting portion formation region 33, a S-G contact hole CH3 is formed, through which the source connecting wire 7sg and the gate connecting wire 3sg are exposed. In this step, the source connecting wire 7sg functions as the etch stop such that only part of the protection layer 9 exposed from the source connecting wire 7sg (end portion 9A) is removed. Also, in this step, the etching is carried out under such a condition that the end portion 9A of the protection layer 9 and an upper portion of part of the gate insulating layer 4 underlying the end portion 9A are removed while a lower portion of the part of the gate insulating layer 4 underlying the end portion 9A remains without being removed. Thereby, a step structure is formed in the gate insulating layer 4. An end surface 71s of the source connecting wire 7sg, an end surface of the protection layer 9, and a lateral surface of the upper portion 41 of the gate insulating layer 4 are in alignment with one another in the thickness direction. When viewed in the normal direction of the substrate, the lower portion 42 remaining in the gate insulating layer 4 without being etched away is formed at a position corresponding to the end portion 9A of the protection layer 9 before it is etched away. The thickness of the lower portion 42 may be not less than 50 nm and not more than 300 nm, or not less than 10% and not more than 80% of the thickness of the gate insulating layer 4, although it depends on the etching conditions and the material to be etched.

In the terminal portion formation region 34, a terminal portion contact hole CH2 is formed, through which the lower connecting portion 3t is exposed. In this step, only part of the protection layer 9 exposed from the second insulating layer 12 (including the end portion 9B) is removed, so that the end portion 5B of the oxide semiconductor connecting portion 5t is exposed inside the terminal portion contact hole CH2. The lateral surfaces of the protection layer 9 and the first insulating layer 11 are in alignment with the lateral surface of the second insulating layer 12. Therefore, a step is formed by the oxide semiconductor connecting portion 5t and the protection layer 9. Further, in the present embodiment, only an upper portion of part 4B of the gate insulating layer 4 underlying the end portion 9B of the protection layer 9 is removed, while the lower portion of the part 4B remains without being removed. Therefore, a step structure is also formed in the gate insulating layer 4. The step structure of the gate insulating layer 4 is the same as the structure formed in the source-gate connecting portion formation region 33. When viewed in the normal direction of the substrate, the lower portion 42 of the gate insulating layer 4 is formed at a position corresponding to the end portion 9B of the protection layer 9 before it is etched away. Therefore, in the terminal portion formation region 34, the lower portion 42 of the gate insulating layer 4 has a pattern defined by the third photomask 63 (FIG. 8).

In the mark formation region 35, the protection layer 9 and part of the gate insulating layer 4 which is not covered with the oxide semiconductor cover 5m are removed. Also herein, a lower portion of part of the gate insulating layer 4 underlying an end portion 9C of the protection layer 9 remains without being removed. Thereby, an island-like insulating film which has a step structure at the end surface can be obtained from the gate insulating layer 4.

Subsequently, as shown in FIG. 7(c), a transparent electrically-conductive film (thickness: not less than 50 nm and not more than 200 nm) is formed on the interlayer insulating layer 13, on the oxide semiconductor cover 5m, and in the contact holes CH1, CH2, CH3 and then patterned. As the transparent electrically-conductive film, for example, an ITO (indium tin oxide) film, an In—Zn—O based oxide (indium zinc oxide) film, a ZnO film (zinc oxide film), or the like, can be used.

Thus, in the TFT formation region 31, a pixel electrode 19 is formed so as to be in contact with the upper electrode 7c (the drain electrode 7d) inside the pixel contact hole CH1.

Also, a transparent connecting portion 19sg is formed so as to be in contact with the source connecting wire 7sg and the gate connecting wire 3sg inside the terminal portion contact hole CH2. The transparent connecting portion 19sg is formed so as to cover the lateral surface of the interlayer insulating layer 13, the upper surface and the lateral surface of the source connecting wire 7sg, the lateral surface of the protection layer 9, the upper surface and the lateral surface of the lower portion 42 of the gate insulating layer 4, and the upper surface of the gate connecting wire 3sg.

In the terminal portion formation region 34, an upper connecting portion 19t is formed so as to be in contact with the lower connecting portion 3t inside the terminal portion contact hole CH2. The upper connecting portion 19t is formed so as to cover the upper surface of the lower connecting portion 3t, the lateral surface and the upper surface of the lower portion 42 of the gate insulating layer 4, the lateral surface of the upper portion 41 of the gate insulating layer 4, the lateral surface and the upper surface of the end portion 5B of the oxide semiconductor connecting portion 5t, the lateral surface of the protection layer 9, and the lateral surface of the interlayer insulating layer 13.

In the mark formation region 35, a transparent electrical conductor cover 19m is formed so as to cover the oxide semiconductor cover 5m. The transparent electrical conductor cover 19m is formed so as to cover the lateral surface and the upper surface of the lower portion 42 of the gate insulating layer 4, the lateral surface of the upper portion 41 of the gate insulating layer 4, and the lateral surface and the upper surface of the oxide semiconductor cover 5m. In such a way, the semiconductor device 1000 is obtained.

Figure 9:
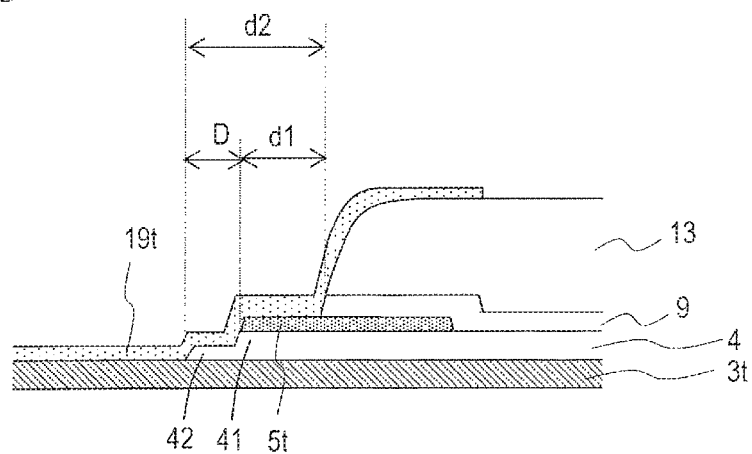
FIG. 9 is a cross-sectional view illustrating a step structure at the lateral wall of a terminal portion contact hole CH2.

FIG. 9 is a cross-sectional view illustrating a step structure at the lateral wall of the terminal portion contact hole CH2 and shows a cross section taken along line A-A' of FIG. 9. When viewed in the normal direction of the substrate, in the terminal portion contact hole CH2, the length of part of the oxide semiconductor connecting portion 5t exposed from the interlayer insulating layer 13, i.e., the distance dl between the lateral surface of the interlayer insulating layer 13 and the lateral surface of the oxide semiconductor connecting portion 5t or the lateral surface of the upper portion 41, may be greater than the length of part of the gate insulating layer 4 exposed from the oxide semiconductor connecting portion 5t (the lower portion 42), i.e., the distance D between the lateral surface of the upper portion 41 of the gate insulating layer 4 and the lateral surface of the lower portion 42. Due to this arrangement, the area of the reduced-thickness portion of the gate insulating layer 4 can be reduced, so that wire corrosion can be suppressed more effectively. The distances d1, D mentioned herein refer to a length in a direction perpendicular to the peripheral portion of the interlayer insulating layer 13 which is defined by the fifth photomask 65 (line A-A') when viewed in the normal direction of the substrate.

As shown in FIG. 8, the distance d1 is determined by the fifth photomask 65 and the second photomask 62 used in patterning the oxide semiconductor film and is, for example, not less than 1 μm and not more than 15 μm (herein, 8.0 μm). The distance D is determined by subtracting the distance d1 from the distance d2 (D=d2−d1) where the distance d2 is determined by the fifth photomask 65 and the third photomask 63 used in patterning the protection layer 9. The distance D is, for example, not less than 1 μm and not more than 10 μm (herein, 4.0 μm).

Now, the oxide semiconductor film (oxide semiconductor layer 5) used in the present embodiment is described. The oxide semiconductor included in the oxide semiconductor layer 5 may be an amorphous oxide semiconductor or may be a crystalline oxide semiconductor which includes a crystalline portion. Examples of the crystalline oxide semiconductor include a polycrystalline oxide semiconductor, a microcrystalline oxide semiconductor, and a crystalline oxide semiconductor in which the c-axis is oriented generally perpendicular to the layer surface.

The oxide semiconductor layer 5 may have a multilayer structure consisting of two or more layers. When the oxide semiconductor layer 5 has a multilayer structure, the oxide semiconductor layer 5 may include a non-crystalline oxide semiconductor layer and a crystalline oxide semiconductor layer. Alternatively, the oxide semiconductor layer 5 may include a plurality of crystalline oxide semiconductor layers which have different crystalline structures. The oxide semiconductor layer 5 may include a plurality of non-crystalline oxide semiconductor layers. When the oxide semiconductor layer 5 has a two-layer structure which includes the upper layer and the lower layer, it is preferred that the energy gap of the oxide semiconductor included in the upper layer is greater than the energy gap of the oxide semiconductor included in the lower layer. Note that, however, when the difference in energy gap between these layers is relatively small, the energy gap of the oxide semiconductor of the lower layer may be greater than the energy gap of the oxide semiconductor of the upper layer.

The materials, structures and film formation methods of the non-crystalline oxide semiconductor and the respective aforementioned crystalline oxide semiconductors, and the configuration of the oxide semiconductor layer which has a multilayer structure, are disclosed in, for example, Japanese Laid-Open Patent Publication No. 2014-007399. The entire disclosure of Japanese Laid-Open Patent Publication No. 2014-007399 is incorporated by reference in this specification.

The oxide semiconductor layer 5 may include, for example, at least one metal element among In, Ga and Zn. In the present embodiment, the oxide semiconductor layer 5 includes, for example, an In—Ga—Zn—O based semiconductor (e.g., indium gallium zinc oxide). Here, the In—Ga—Zn—O based semiconductor is a ternary oxide including In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. The oxide semiconductor layer 5 which has such a composition can be formed out of an oxide semiconductor film which includes an In—Ga—Zn—O based semiconductor.

The In—Ga—Zn—O based semiconductor may be amorphous or may be crystalline. As the crystalline In—Ga—Zn—O based semiconductor, a crystalline In—Ga—Zn—O based semiconductor in which the c-axis is oriented generally perpendicular to the layer surface is preferred.

The crystalline structure of the crystalline In—Ga—Zn—O based semiconductor is disclosed in, for example, aforementioned Japanese Laid-Open Patent Publication No. 2014-007399, Japanese Laid-Open Patent Publication No. 2012-134475, and Japanese Laid-Open Patent Publication No. 2014-209727. The entire disclosures of Japanese Laid-Open Patent Publication No. 2012-134475 and Japanese Laid-Open Patent Publication No. 2014-209727 are incorporated by reference in this specification. A TFT which includes an In—Ga—Zn—O based semiconductor layer has high mobility (20 times or more as compared with an a-Si TFT) and low current leakage (less than 1/100 as compared with an a-Si TFT), and is therefore suitably used as a driver TFT (e.g., a TFT included in a driving circuit provided around the display region including a plurality of pixels on the same substrate as the display region) and a pixel TFT (a TFT provided in a pixel).

The oxide semiconductor layer 5 may contain a different oxide semiconductor instead of the In—Ga—Zn—O based semiconductor. For example, the oxide semiconductor layer 5 may contain an In—Sn—Zn—O based semiconductor (e.g., $In_2O_3$—$SnO_2$—ZnO; InSnZnO). In—Sn—Zn—O based semiconductor is a ternary oxide including In (indium), Sn (tin) and Zn (zinc). Alternatively, the oxide semiconductor layer 5 may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, or the like.

(Second Embodiment)

Hereinafter, the second embodiment of the semiconductor device of the present invention is described with reference to the drawings. The semiconductor device of the present embodiment is different from the embodiment which has previously been described with reference to FIG. 1 to FIG. 5 in that the oxide semiconductor connecting portion 5t is not provided at the terminal portion. The configurations of the TFTs, the capacitive elements, the source-gate connecting portion and the mark portion are the same as those of the previously-described embodiment.

FIGS. 10(a) and 10(b) are respectively a plan view and a cross-sectional view of a terminal portion in the present embodiment. The same components as those of FIG. 3 are designated by the same reference numerals, and the description thereof will sometimes be omitted.

A terminal portion 201A includes the lower connecting portion 3t formed out of the gate conductive film, the insulating layer 15 formed on the lower connecting portion 3t, and the upper connecting portion 19t formed out of the same transparent electrically-conductive film as the pixel electrode. The lower connecting portion 3t may be the gate wire G or the gate connecting wire 3sg. The insulating layer 15 includes the gate insulating layer 4, the protection layer 9 and the interlayer insulating layer 13. The upper connecting portion 19t is in contact with the lower connecting portion 3t inside the terminal portion contact hole CH2 formed in the insulating layer 15. In the terminal portion formation region, the oxide semiconductor film has been removed.

In the present embodiment, at the lateral wall of the terminal portion contact hole CH2, the gate insulating layer 4 has a step structure as in the previously-described embodiment. That is, the gate insulating layer 4 includes the upper portion 41 and the lower portion 42 that is at a position closer to the substrate side than the upper portion 41. The lateral surface 42s of the lower portion 42 juts out from the lateral surface 41s of the upper portion 41. At the lateral wall of the terminal portion contact hole CH2, the lateral surface 41s of the upper portion 41 of the gate insulating layer 4, the lateral surface 9s of the protection layer 9, and the lateral surface 13s of the interlayer insulating layer 13 are in alignment with one another.

Inside the terminal portion contact hole CH2, the upper connecting portion 19t is arranged so as to cover the lower connecting portion 3t, the lateral surface 42s and the upper surface 42u of the lower portion 42 of the gate insulating layer 4, the lateral surface 41s of the upper portion 41, the lateral surface 9s of the protection layer 9, the lateral surface 13s of the interlayer insulating layer 13, and part of the upper surface of the interlayer insulating layer 13.

In the terminal portion 201A of the present embodiment, the lateral wall of the terminal portion contact hole CH2 has a tapered shape which is defined by the step structure of the gate insulating layer 4. Therefore, the coverage of the upper connecting portion 19t can be improved, so that corrosion of the lower connecting portion 3t can be suppressed. Since the lower connecting portion 3t is covered not only with the gate insulating layer 4 but also with the protection layer 9, corrosion of the lower connecting portion 3t due to moisture can be suppressed more effectively.

Figure 11:
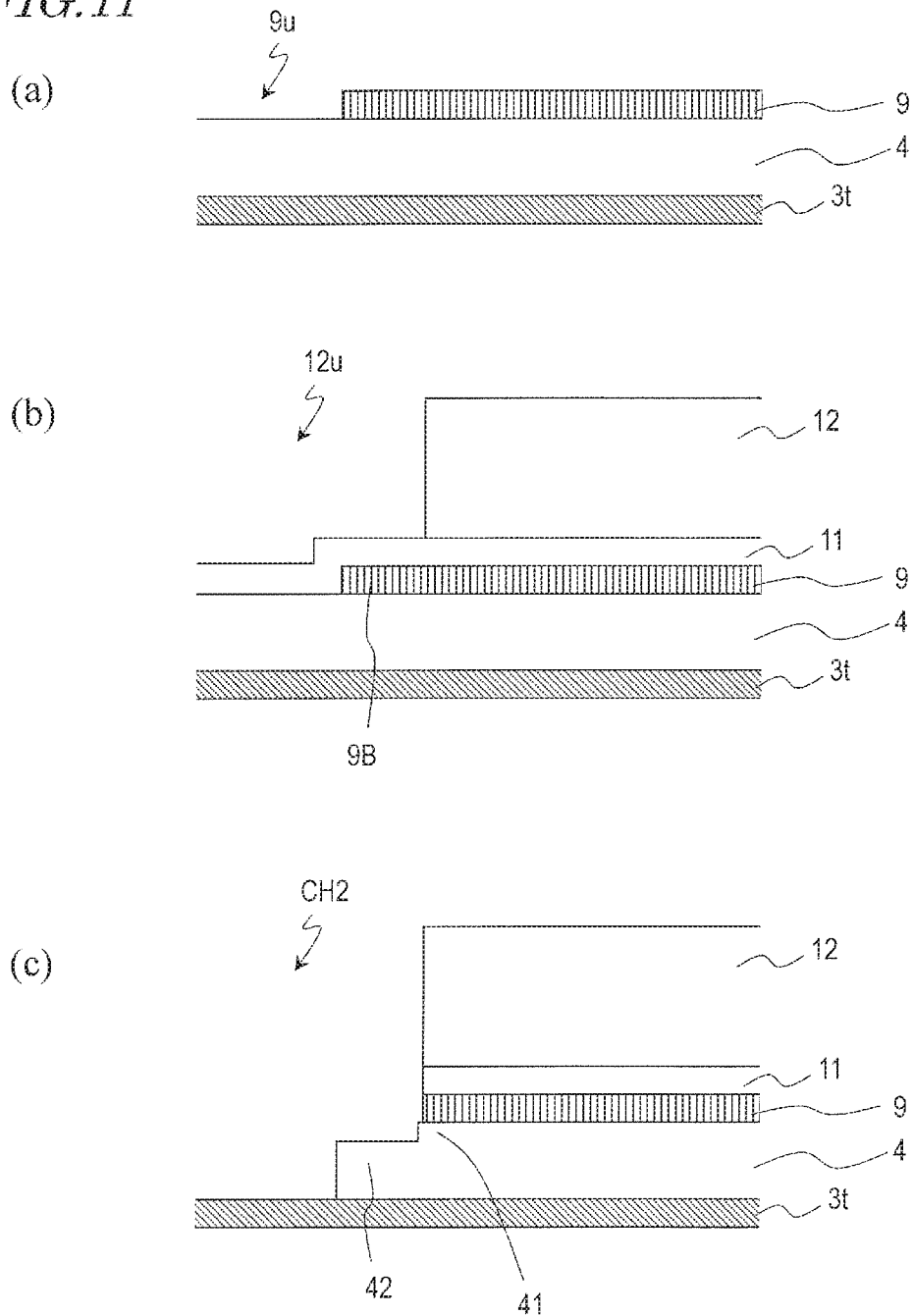
FIGS. 11(a) to 11(c) are schematic stepwise cross-sectional views for illustrating a manufacturing method of the semiconductor device of the second embodiment.

The terminal portion 201A is manufactured as follows. FIGS. 11(a) to 11(c) are stepwise cross-sectional views for illustrating an example of a method for forming the terminal portion 201A in the terminal portion formation region. The materials, thickness, and formation method of the respective layers are the same as those previously described with reference to FIG. 6 and FIG. 7, and therefore the descriptions thereof are herein omitted.

First, as shown in FIG. 11(a), a lower connecting portion 3t and a gate insulating layer 4 are formed in the terminal portion formation region. Then, an oxide semiconductor film is deposited, and patterning of the oxide semiconductor film is carried out. Thereby, the oxide semiconductor film is removed from the terminal portion formation region. Then, a protection layer 9 which has an opening 9u is formed on the gate insulating layer 4. When viewed in the normal direction of the substrate, the opening 9u is arranged so as to overlap the lower connecting portion 3t.

Then, as shown in FIG. 11(b), a first insulating layer 11 is formed so as to cover the gate insulating layer 4 and the protection layer 9. Subsequently, a second insulating layer 12 is formed, and an opening 12u is formed in the second insulating layer 12. The opening 12u is arranged so as to overlap the end portion 9B of the protection layer 9 when viewed in the normal direction of the substrate.

Subsequently, as shown in FIG. 11(c), the first insulating layer 11, the protection layer 9 and the gate insulating layer 4 are patterned using the second insulating layer 12 as a mask, whereby a terminal portion contact hole CH2 is formed. The patterning is carried out under such a condition that the end portion 9B of the protection layer 9 and the upper portion of part of the gate insulating layer 4 underlying the end portion 9B of the protection layer 9 are removed while the lower portion remains without being removed. Thereby, a step structure is formed in the gate insulating layer 4.

Then, although not shown, an upper connecting portion 19t is formed in the terminal portion contact hole CH2 and on the second insulating layer 12. In such a way, the terminal portion 201A is obtained.

(Third Embodiment)

Hereinafter, the third embodiment of the semiconductor device of the present invention is described with reference to the drawings.

In the terminal portions 201, 201A which have previously been described with reference to FIG. 3 and FIG. 10, the upper connecting portion 19t extends from the bottom surface of the terminal portion contact hole CH2 to the upper surface of the interlayer insulating layer 13 across the lateral wall. The end portion of the upper connecting portion 19t is provided on the interlayer insulating layer 13. On the other hand, the present embodiment is different from the previously-described terminal portions 201, 201A in that the upper connecting portion 19t partially covers the lateral surface of the terminal portion contact hole CH2 and that the end portion of the upper connecting portion 19t is provided in the terminal portion contact hole CH2.

FIGS. 12(a) and 12(b) are respectively a plan view and a cross-sectional view of a terminal portion 201B in the present embodiment. The same components as those of FIG. 3 are designated by the same reference numerals, and the description thereof will sometimes be omitted.

In the terminal portion 201B, the upper connecting portion 19t is arranged so as to cover the lower connecting portion 3t which is exposed at the bottom surface of the terminal portion contact hole CH2, the lateral surface 42s of the lower portion 42 of the gate insulating layer 4, and at least part of the upper surface 42u of the lower portion 42. The end portion 19E (an end portion on the display region side) of the upper connecting portion 19t is present on the upper surface 42u of the lower portion 42. The other features are the same as those shown in FIG. 3.

Also in the present embodiment, the coverage of the upper connecting portion 19t can be improved by the step structure formed at the lateral wall of the terminal portion contact hole CH2. Therefore, corrosion of the lower connecting portion 3t can be suppressed. Further, the area of the upper connecting portion 19t can be reduced as compared with the terminal portion 201 shown in FIG. 3. Further, since the upper connecting portion 19t can be provided only in the terminal portion contact hole CH2, leakage between adjoining two of a plurality of aligned terminal portions can be suppressed.

The shape of the upper connecting portion 19t is not limited to the illustrated example. The upper connecting portion 19t only needs to extend from the lower connecting portion 3t to at least part of the upper surface 42u of the lower portion 42. The upper connecting portion 19t may extend to the lateral surface and the upper surface of the oxide semiconductor connecting portion 5t.

For example, as illustrated in FIGS. 13(a) and 13(b), the upper connecting portion 19t may extend to at least part of the upper surface 5tu of the oxide semiconductor connecting portion 5t, and the end portion 19E of the upper connecting portion 19t may be present on the upper surface 5tu of the oxide semiconductor connecting portion 5t. Due to this arrangement, the coverage of the upper connecting portion 19t can be improved more effectively with the utilization of the two steps in the terminal portion contact hole CH2. Although in the configuration shown in FIG. 12 part of the lower connecting portion 3t is covered only with the lower portion 42 of the gate insulating layer 4, the configuration shown in FIG. 13 does not include such a portion, so that corrosion of the lower connecting portion 3t can be suppressed more assuredly.

FIGS. 14(a) and 14(b) are respectively a plan view and a cross-sectional view of another terminal portion 201D in the present embodiment. The same components as those of FIG. 10 are designated by the same reference numerals, and the description thereof will sometimes be omitted.

In the terminal portion 201D, the upper connecting portion 19t is arranged so as to cover the lower connecting portion 3t exposed at the bottom surface of the terminal portion contact hole CH2, the lateral surface 42s of the lower portion 42 of the gate insulating layer 4, and at least part of the upper surface 42u of the lower portion 42 of the gate insulating layer 4. The end portion 19E (an end portion on the display region side) of the upper connecting portion 19t is present on the upper surface 42u of the lower portion 42. The other features are the same as those shown in FIG. 10.

Also in the terminal portion 201D, as previously described, the coverage of the upper connecting portion 19t can be improved by the step structure formed at the lateral wall of the terminal portion contact hole CH2. Since the upper connecting portion 19t can be provided only in the terminal portion contact hole CH2, leakage between adjoining terminal portions can be suppressed.

(Fourth Embodiment)

Hereinafter, the fourth embodiment of the semiconductor device of the present invention is described with reference to the drawings. The semiconductor device of the present embodiment is an active matrix substrate which includes oxide semiconductor TFTs and crystalline silicon TFTs on the same substrate.

The active matrix substrate includes a TFT (pixel TFT) in each pixel. As the pixel TFT, an oxide semiconductor TFT which includes, for example, an In—Ga—Zn—O based semiconductor film as the active layer is used.

Part or the entirety of the peripheral driving circuit may be integrally formed on the same substrate as the pixel TFTs. Such an active matrix substrate is referred to as a driver-monolithic active matrix substrate. In the driver-monolithic active matrix substrate, the peripheral driving circuit is provided in a region (non-display region or frame region) exclusive of a region including a plurality of pixels (display region). TFTs which are constituents of the peripheral driving circuit (circuit TFTs) are, for example, crystalline silicon TFTs which include a polycrystalline silicon film as the active layer. Thus, when oxide semiconductor TFTs are used as the pixel TFTs and crystalline silicon TFTs are used as the circuit TFTs, the power consumption can be reduced in the display region, and further, the frame region can be reduced.

The TFT 101 which has previously been described with reference to FIG. 1 and FIG. 2 is applicable to the pixel TFTs. This point will be described later.

Next, a more specific configuration of the active matrix substrate of the present embodiment is described with reference to the drawings.

Figure 16:
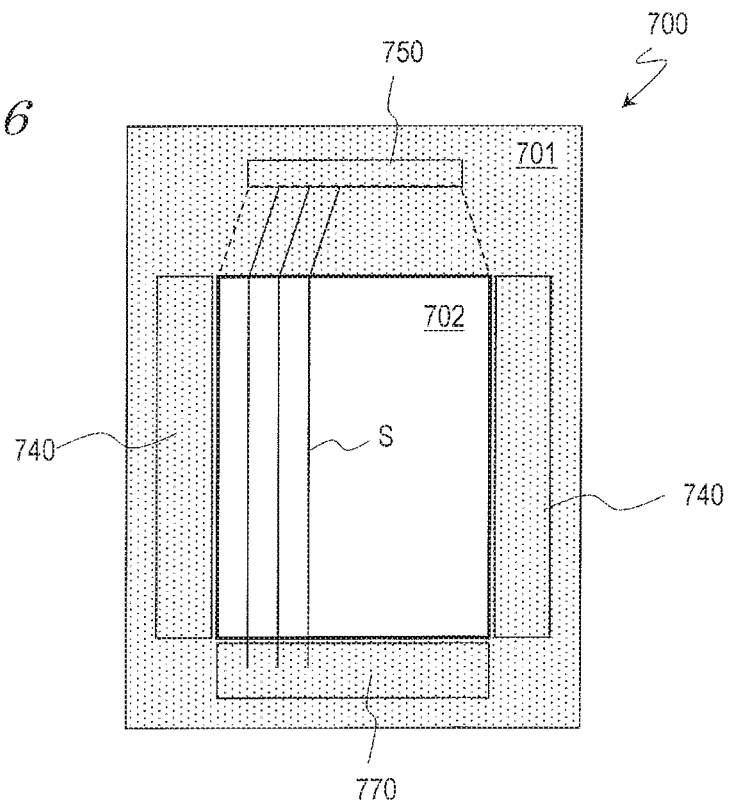
FIG. 16 is a schematic plan view showing an example of a planar configuration of an active matrix substrate 700 of the fourth embodiment.
Figure 17:
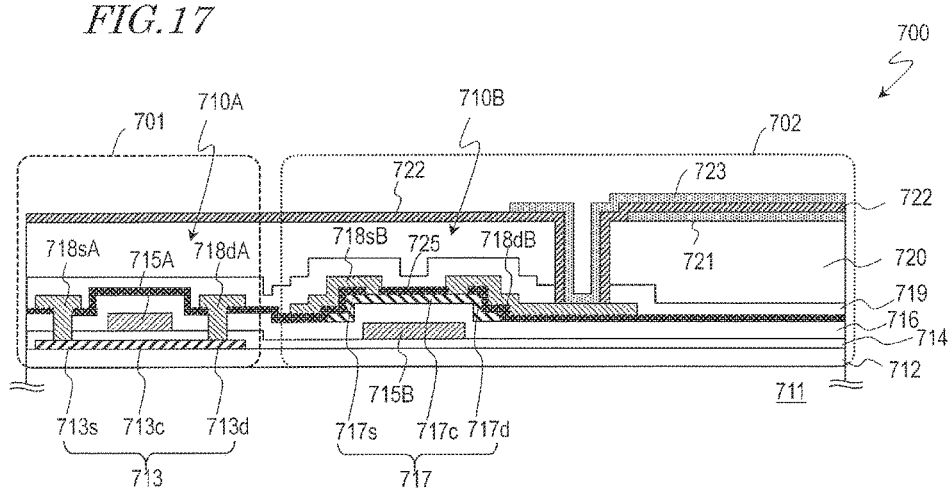
FIG. 17 is a cross-sectional view of a crystalline silicon TFT 710A and an oxide semiconductor TFT 710B in the active matrix substrate 700.

FIG. 16 is a schematic plan view showing an example of a planar configuration of an active matrix substrate 700 of the present embodiment. FIG. 17 is a cross-sectional view showing a cross-sectional configuration of a crystalline silicon TFT (hereinafter, referred to as "first thin film transistor") 710A and an oxide semiconductor TFT (hereinafter, referred to as "second thin film transistor") 710B in the active matrix substrate 700.

As shown in FIG. 16, the active matrix substrate 700 includes a display region 702 including a plurality of pixels and a region exclusive of the display region 702 (non-display region). The non-display region includes a driving circuit formation region 701 in which the driving circuit is to be provided. In the driving circuit formation region 701, for example, a gate driver circuit 740 and a check circuit 770 are provided. In the display region 702, a plurality of gate bus lines (not shown) extending in the row direction and a plurality of source bus lines S extending in the column direction are provided. Although not shown, each pixel is defined by the gate bus lines and the source bus lines S. The gate bus lines are respectively connected with corresponding terminals of the gate driver circuit. The source bus lines S are respectively connected with corresponding terminals of a driver IC 750 mounted to the active matrix substrate 700. To the terminals of the driver IC 750, the terminal portions 201, 201A, 201B, 201C, 201D which have previously been described with reference to FIG. 1, FIG. 3, FIG. 10, FIG. 12, FIG. 13 and FIG. 14 are applicable. Further, in the vicinity of the display region 702 in the driving circuit formation region 701, the source-gate connecting portion 203 which has previously been described with reference to FIG. 1 and FIG. 4 can be located.

As shown in FIG. 17, in the active matrix substrate 700, the second thin film transistor 710B is provided as a pixel TFT in each pixel of the display region 702, and the first thin film transistor 710A is provided as a circuit TFT in the driving circuit formation region 701.

The active matrix substrate 700 includes a substrate 711, an underlayer film 712 provided on the surface of the substrate 711, a first thin film transistor 710A provided on the underlayer film 712, and a second thin film transistor 710B provided on the underlayer film 712. The first thin film transistor 710A is a crystalline silicon TFT in which the active region includes crystalline silicon as a major constituent. The second thin film transistor 710B is an oxide semiconductor TFT in which the active region includes an oxide semiconductor as a major constituent. The first thin film transistor 710A and the second thin film transistor 710B are integrally formed in the substrate 711. The "active region" mentioned herein refers to part of a semiconductor layer that is to be the active layer of the TFT in which a channel is to be formed.

The first thin film transistor 710A includes a crystalline silicon semiconductor layer (e.g., low-temperature polysilicon layer) 713 provided on the underlayer film 712, a first insulating layer 714 covering the crystalline silicon semiconductor layer 713, and a gate electrode 715A provided on the first insulating layer 714. Part of the first insulating layer 714 which is present between the crystalline silicon semiconductor layer 713 and the gate electrode 715A functions as the gate insulating film of the first thin film transistor 710A. The crystalline silicon semiconductor layer 713 includes a region 713*c* in which a channel is to be formed (active region) and a source region 713*s* and a drain region 713*d* which are located at opposite sides of the active region. In this example, part of the crystalline silicon semiconductor layer 713 overlapping the gate electrode 715A with the first insulating layer 714 interposed therebetween forms an active region 713*c*. The first thin film transistor 710A also includes a source electrode 718*s*A and a drain electrode 718*d*A which are connected with the source region 713*s* and the drain region 713*d*, respectively. The source and drain electrodes 718*s*A, 718*d*A may be provided on an interlayer insulating film (herein, a second insulating layer 716) that covers the gate electrode 715A and the crystalline silicon semiconductor layer 713 so as to be connected with the crystalline silicon semiconductor layer 713 inside a contact hole formed in the interlayer insulating film.

The second thin film transistor 710B includes a gate electrode 715B provided on the underlayer film 712, a second insulating layer 716 covering the gate electrode 715B, and an oxide semiconductor layer 717 provided on the second insulating layer 716. As illustrated, the first insulating layer 714 which is the gate insulating film of the first thin film transistor 710A may be extended to a region in which the second thin film transistor 710B is to be formed. In this case, the oxide semiconductor layer 717 may be provided on the first insulating layer 714. Part of the second insulating layer 716 which is present between the gate electrode 715B and the oxide semiconductor layer 717 functions as the gate insulating film of the second thin film transistor 710B. The oxide semiconductor layer 717 includes a region 717*c* in which a channel is to be formed (active region) and a source contact region 717*s* and a drain contact region 717*d* which are located at opposite sides of the active region. In this example, part of the oxide semiconductor layer 717 overlapping the gate electrode 715B with the second insulating layer 716 interposed therebetween forms an active region 717*c*. On the oxide semiconductor layer 717, a protection layer (etch stop layer) 725 is provided. The protection layer 725 is in contact with the active region 717*c* of the oxide semiconductor layer 717 and has openings through which the source contact region 717*s* and the drain contact region 717*d* are respectively exposed. The second thin film transistor 710B further includes a source electrode 718*s*B and a drain electrode 718*d*B which are connected with the source contact region 717*s* and the drain contact region 717*d*, respectively, in the respective openings of the protection layer 725. Note that the second thin film transistor 710B can alternatively be configured such that the underlayer film 712 is not provided on the substrate 711.

The thin film transistors 710A, 710B are covered with a passivation film 719 and a flattening film 720. In the second thin film transistor 710B which functions as a pixel TFT, the gate electrode 715B is connected with a gate bus lines (not shown), the source electrode 718*s*B is connected with a source bus line (not shown), and the drain electrode 718*d*B is connected with a pixel electrode 723. In this example, the drain electrode 718*d*B is connected with a corresponding pixel electrode 723 inside an opening formed in the passivation film 719 and the flattening film 720. A video signal is supplied to the source electrode 718*s*B via the source bus line, and a necessary charge is written in the pixel electrode 723 based on a gate signal from the gate bus lines.

As illustrated, a transparent electrically-conductive layer 721 may be provided as a common electrode on the flattening film 720, and the third insulating layer 722 may be provided between the transparent electrically-conductive layer (common electrode) 721 and the pixel electrode 723. In this case, the pixel electrode 723 may have an opening in the form of a slit. Such an active matrix substrate 700 is applicable to, for example, FFS (Fringe Field Switching) mode display devices. The FFS mode is a transverse electric field mode in which a pair of electrodes are provided on one substrate such that an electric field can be applied to liquid crystal molecules in a direction parallel to the substrate surface (transverse direction). In this example, an electric field produced is represented by a line of electric force extending from the pixel electrode 723 and passing through the liquid crystal layer (not shown) and then through the slit opening of the pixel electrode 723 before reaching the common electrode 721. This electric field includes a component transverse to the liquid crystal layer. As a result, a transverse electric field can be applied across the liquid crystal layer. In the transverse electric field mode, the liquid crystal molecules do not rise from the substrate, and therefore, there is an advantage that a wide viewing angle can be realized as compared with the vertical electric field mode.

As the second thin film transistor 710B of the present embodiment, the TFT 101 that has previously been described with reference to FIG. 1 and FIG. 2 can be applied as a pixel TFT. When the TFT 101 is applied, the gate electrode 3, the gate insulating layer 4, the oxide semiconductor layer 5, and the source and drain electrodes 7s, 7d of the TFT 101 may respectively correspond to the gate electrode 715B, the second insulating layer (gate insulating layer) 716, the oxide semiconductor layer 717, and the source and drain electrode 718sB, 718dB shown in FIG. 17.

As a TFT which is a constituent of the check circuit 770 shown in FIG. 16 (check TFT), the thin film transistor 710B that is an oxide semiconductor TFT may be used.

Although not shown, the check TFT and the check circuit may be provided in, for example, a region to which the driver IC 750 shown in FIG. 16 is to be mounted. In this case, the check TFT is provided between the driver IC 750 and the substrate 711.

In the illustrated example, the first thin film transistor 710A has a top gate configuration where the crystalline silicon semiconductor layer 713 is provided between the gate electrode 715A and the substrate 711 (underlayer film 712). On the other hand, the second thin film transistor 710B has a bottom gate configuration where the gate electrode 715B is provided between the oxide semiconductor layer 717 and the substrate 711 (underlayer film 712). By using such a configuration, increase in the number of manufacturing steps and the manufacturing cost can be effectively suppressed in integrally forming two different types of thin film transistors 710A, 710B on the same substrate 711.

The TFT configuration of the first thin film transistor 710A and the second thin film transistor 710B is not limited to the above-described examples. For example, these thin film transistors 710A, 710B may have the same TFT configuration. For example, the first thin film transistor 710A may have a bottom gate configuration.

The second insulating layer 716, which is the gate insulating film of the second thin film transistor 710B, may be extended to a region in which the first thin film transistor 710A is to be formed and may function as an interlayer insulating film which covers the gate electrode 715A and the crystalline silicon semiconductor layer 713 of the first thin film transistor 710A. In the case where the interlayer insulating film of the first thin film transistor 710A and the gate insulating film of the second thin film transistor 710B are thus provided in the same layer (second insulating layer) 716, the second insulating layer 716 may have a multilayer structure. For example, the second insulating layer 716 may have a multilayer structure including a hydrogen donating layer which is capable of supplying hydrogen (e.g., silicon nitride layer) and an oxygen donating layer provided on the hydrogen donating layer which is capable of supplying oxygen (e.g., silicon oxide layer).

The gate electrode 715A of the first thin film transistor 710A and the gate electrode 715B of the second thin film transistor 710B may be provided in the same layer. The source and drain electrodes 718sA, 718dA of the first thin film transistor 710A and the source and drain electrodes 718sB, 718dB of the second thin film transistor 710B may be provided in the same layer. Being "provided in the same layer" refers to being formed using the same film (electrically-conductive film). With such a configuration, increase in the number of manufacturing steps and the manufacturing cost can be suppressed.

INDUSTRIAL APPLICABILITY

The embodiments of the present invention are widely applicable to an oxide semiconductor TFT and a variety of semiconductor devices which include the oxide semiconductor TFT. For example, the present invention is also applicable to circuit boards such as active matrix substrates, display devices such as liquid crystal display devices, organic electroluminescence (EL) display devices, and inorganic electroluminescence display devices, imaging devices such as image sensor devices, and various electronic devices such as image input devices, fingerprint readers, and semiconductor memories.

REFERENCE SIGNS LIST

1 substrate
3 gate electrode
3m mark
3sg gate connecting wire
3t lower connecting portion
4 gate insulating layer
5 oxide semiconductor layer
5m oxide semiconductor cover
5t oxide semiconductor connecting portion
7c upper electrode of storage capacitance
7d drain electrode
7s source electrode
7sg source connecting wire
9 protection layer
11 first insulating layer
12 second insulating layer
13 interlayer insulating layer
19 pixel electrode
19m transparent electrical conductor cover
19sg transparent connecting portion
19t upper connecting portion
21 mark cover
41 upper portion of gate insulating layer
42 lower portion of gate insulating layer
101 TFT
105 storage capacitance
201, 201A, 201B, 201C, 201D terminal portion
203 source-gate connecting portion
205 mark portion
1000 semiconductor device

The invention claimed is:

1. A semiconductor device comprising: a substrate; a thin film transistor supported by the substrate; an interlayer insulating layer covering the thin film transistor; and a wire connecting portion, wherein the thin film transistor includes a gate electrode provided on the substrate, a gate insulating layer covering the gate electrode, an oxide semiconductor layer provided on the gate insulating layer, a protection layer covering at least a channel region of the oxide semiconductor layer, and a source electrode and a drain electrode, each of which is in contact with the oxide semiconductor layer, the wire connecting portion includes
a lower electrically-conductive portion formed out of a same electrically-conductive film as the gate electrode,
an insulating layer which is provided on the lower electrically-conductive portion and which has a contact hole through which at least a part of the lower electrically-conductive portion is exposed, and an upper electrically-conductive portion, at least a part of which is provided inside the contact hole, the insulating layer includes the gate insulating layer, the protection layer and the interlayer insulating layer, at a lateral wall of the contact hole, the gate insulating layer includes an upper portion and a lower portion which is present on the substrate side of the upper portion, and when viewed in a normal direction of the substrate, a lateral surface of the lower portion juts out from a lateral surface of the upper portion, and the upper electrically-conductive portion is in contact with the lower electrically-conductive portion and the lateral surface and an upper surface of the lower portion of the gate insulating layer inside the contact hole, and the semiconductor device further includes a mark portion formed out of a same electrically-conductive film as the gate electrode;

an island-shaped insulating film covering the mark portion;

an oxide semiconductor cover portion formed out of a same semiconductor film as the oxide semiconductor layer and arranged so as to at least partially overlap the mark portion with the insulating film interposed therebetween; and an upper electrical conductor cover portion covering the oxide semiconductor cover portion, wherein at a periphery of the insulating film, the insulating film includes another upper portion and another lower portion which is present on the substrate side of the another upper portion, a lateral surface of the another lower portion jutting out from a lateral surface of the another upper portion when viewed in the normal direction of the substrate, the lateral surface of the another upper portion is in alignment with a lateral surface of the oxide semiconductor cover portion, and the upper electrical conductor cover portion is arranged so as to be in contact with the lateral surface and an upper surface of the another lower portion, the lateral surface of the another upper portion, and the lateral surface and an upper surface of the oxide semiconductor cover portion.

2. The semiconductor device of claim 1, wherein the wire connecting portion includes an oxide semiconductor connecting portion located between the protection layer and the gate insulating layer and formed out of a same semiconductor film as the oxide semiconductor layer, when viewed in the normal direction of the substrate, at the lateral wall of the contact hole, a lateral surface of the oxide semiconductor connecting portion is present between a lateral surface of the protection layer and the lateral surface of the lower portion of the gate insulating layer, and the upper electrically-conductive portion inside the contact hole is further in contact with the lateral surface of the upper portion of the gate insulating layer and with the lateral surface and an upper surface of the oxide semiconductor connecting portion.

3. The semiconductor device of claim 1 wherein, at the lateral wall of the contact hole, the lateral surface of the upper portion of the gate insulating layer is in alignment with the lateral surface of the protection layer.

4. The semiconductor device of claim 1, wherein the upper electrically-conductive portion extends from a bottom surface of the contact hole to an upper surface of the interlayer insulating layer across the lateral wall.

5. The semiconductor device of claim 1, wherein the upper electrically-conductive portion includes an end portion on the upper surface of the lower portion of the gate insulating layer.

6. The semiconductor device of claim 1, wherein the wire connecting portion further includes a source connecting portion which is present between the protection layer and the interlayer insulating layer and which is formed out of a same electrically-conductive film as the source electrode, when viewed in the normal direction of the substrate, at the lateral wall of the contact hole, a lateral surface of the source connecting portion lies inward of the lateral surface of the lower portion of the gate insulating layer, and the upper electrically-conductive portion inside the contact hole is further in contact with the lateral surface of the upper portion of the gate insulating layer, the lateral surface of the protection layer, and the lateral surface and an upper surface of the source connecting portion.

7. The semiconductor device of claim 1, wherein the oxide semiconductor layer includes an In—Ga—Zn—O based semiconductor.

8. The semiconductor device of claim 2 wherein, at the lateral wall of the contact hole, the lateral surface of the upper portion of the gate insulating layer is in alignment with the lateral surface of the oxide semiconductor connecting portion.

9. The semiconductor device of claim 2, wherein the upper electrically-conductive portion includes an end portion on the upper surface of the oxide semiconductor connecting portion.

10. The semiconductor device of claim 6, wherein the lateral surface of the source connecting portion is in alignment with the lateral surface of the protection layer and the lateral surface of the upper portion of the gate insulating layer.

11. The semiconductor device of claim 7, wherein the oxide semiconductor layer includes a crystalline portion.

12. A semiconductor device comprising: a substrate; a thin film transistor supported by the substrate; an interlayer insulating layer covering the thin film transistor; and a wire connecting portion, wherein the thin film transistor includes a gate electrode provided on the substrate, a gate insulating layer covering the gate electrode, an oxide semiconductor layer provided on the gate insulating layer, a protection layer covering at least a channel region of the oxide semiconductor layer, and a source electrode and a drain electrode, each of which is in contact with the oxide semiconductor layer, the wire connecting portion includes a lower electrically-conductive portion formed out of a same electrically-conductive film as the gate electrode, an insulating layer which is provided on the lower electrically-conductive portion and which has a contact hole through which at least a part of the lower electrically-conductive portion is exposed, and an upper electrically-conductive portion, at least a part of which is provided inside the contact hole, the insulating layer includes the gate insulating layer, the protection layer and the interlayer insulating layer, at a lateral wall of the contact hole, the gate insulating layer includes an upper portion and a lower portion which is present on the substrate side of the upper portion, and when viewed in a normal direction of the substrate, a lateral surface of the lower portion juts out from a lateral surface of the upper portion, the upper electrically-conductive portion is in contact with the lower electrically-conductive portion and the lateral surface and an upper surface of the lower portion of the gate insulating layer inside the contact hole, and when viewed in the normal direction of the substrate, at the lateral wall of the contact hole, a distance D between the lateral surface of the upper portion of the gate insulating layer and the lateral surface of the lower portion of the gate insulating layer is not less than 1 μm and not more than 10 μm.

13. The semiconductor device of claim 12, wherein
the wire connecting portion includes an oxide semiconductor connecting portion located between the protection layer and the gate insulating layer and formed out of a same semiconductor film as the oxide semiconductor layer, when viewed in the normal direction of the substrate, at the lateral wall of the contact hole, a lateral surface of the oxide semiconductor connecting portion is present between a lateral surface of the protection layer and the lateral surface of the lower portion of the gate insulating layer, and the upper electrically-conductive portion inside the contact hole is further in contact with the lateral surface of the upper portion of the gate insulating layer and with the lateral surface and an upper surface of the oxide semiconductor connecting portion.

14. The semiconductor device of claim 12 wherein, at the lateral wall of the contact hole, the lateral surface of the upper portion of the gate insulating layer is in alignment with the lateral surface of the protection layer.

15. The semiconductor device of claim 12, wherein the upper electrically-conductive portion extends from a bottom surface of the contact hole to an upper surface of the interlayer insulating layer across the lateral wall.

16. A method for manufacturing a semiconductor device which includes a thin film transistor and a wire connecting portion, the method comprising:
(A) forming a gate conductive film on a substrate and patterning the gate conductive film such that a gate electrode of the thin film transistor is formed in a TFT formation region in which the thin film transistor is to be formed and that a lower electrically-conductive portion of the wire connecting portion is formed in a wire connecting portion formation region in which the wire connecting portion is to be formed;
(B) forming a gate insulating layer so as to cover the gate electrode and the lower electrically-conductive portion;
(C) forming an oxide semiconductor film on the gate insulating layer and patterning the oxide semiconductor film, thereby forming an oxide semiconductor layer of the thin film transistor;
(D) forming a protection layer on the oxide semiconductor layer and the gate insulating layer so as to cover at least a channel region of the oxide semiconductor layer, the protection layer also being extended over the wire connecting portion formation region, the protection layer having an opening overlapping part of the lower electrically-conductive portion when viewed in a normal direction of the substrate;
(E) forming a source conductive film so as to cover the oxide semiconductor layer and patterning the source conductive film such that a source electrode and a drain electrode of the thin film transistor are formed, thereby obtaining the thin film transistor;
(F) forming an interlayer insulating layer so as to cover the thin film transistor, the interlayer insulating layer also being extended over the wire connecting portion formation region,
(G) etching the interlayer insulating layer, the protection layer and the gate insulating layer such that a contact hole is formed in the wire connecting portion formation region, through which part of the lower electrically-conductive portion is exposed, the etching being carried out under such a condition that an end portion of the protection layer and an upper portion of part of the gate insulating layer underlying the end portion of the protection layer are removed while a lower portion of the part of the gate insulating layer underlying the end portion of the protection layer remains, so that at a lateral wall of the contact hole, the gate insulating layer includes an upper portion and a lower portion which is present on the substrate side of the upper portion and has such a step structure that the lower portion juts out from the upper portion when viewed in the normal direction of the substrate; and
(H) inside the contact hole, forming an upper electrically-conductive portion so as to be in contact with the part of the lower electrically-conductive portion and the lateral surface and an upper surface of the lower portion of the gate insulating layer, thereby obtaining the wire connecting portion.

17. The method of claim 16, wherein
(C) includes patterning the oxide semiconductor film, thereby forming an island-like oxide semiconductor connecting portion in the wire connecting portion formation region,
(D) includes forming the protection layer so as to cover the lateral surface and an upper surface of the oxide semiconductor connecting portion,
(E) includes patterning the source conductive film under such a condition that the oxide semiconductor connecting portion functions as an etch stop, and
when viewed in the normal direction of the substrate, at the lateral wall of the contact hole, the lateral surface of the oxide semiconductor connecting portion is present between the lateral surface of the protection layer and the lateral surface of the lower portion of the gate insulating layer.

18. The method of claim 16, wherein
the interlayer insulating layer formed in (F) includes a first insulating layer which is an inorganic insulating layer and a second insulating layer which is an organic insulating layer formed on the first insulating layer, and
(G) includes patterning the second insulating layer and etching together the first insulating layer, the protection layer and the gate insulating layer using the patterned second insulating layer as a mask.

19. The method of claim 16, wherein the oxide semiconductor layer includes an In—Ga—Zn—O based semiconductor.

20. The method of claim 19, wherein the oxide semiconductor layer includes a crystalline portion.

* * * * *